(12) United States Patent (10) Patent No.: US 8,188,468 B2
Ohmi et al. (45) Date of Patent: May 29, 2012

(54) COMPOUND-TYPE THIN FILM, METHOD OF FORMING THE SAME, AND ELECTRONIC DEVICE USING THE SAME

(75) Inventors: Tadahiro Ohmi, Sendai (JP); Hirokazu Asahara, Kyoto (JP); Atsutoshi Inokuchi, Nirasaki (JP); Kohei Watanuki, Tokyo (JP)

(73) Assignees: National University Corporation Tohoku University, Miyagi (JP); Rohm Co., Ltd., Kyoto (JP); Tokyo Electron Limited, Tokyo (JP); Ube Industries, Ltd., Yamaguchi (JP)

( * ) Notice: Subject to any disclaimer, the term of this patent is extended or adjusted under 35 U.S.C. 154(b) by 259 days.

(21) Appl. No.: 12/601,684

(22) PCT Filed: May 2, 2008

(86) PCT No.: PCT/JP2008/058405
§ 371 (c)(1),
(2), (4) Date: Nov. 24, 2009

(87) PCT Pub. No.: WO2008/146575
PCT Pub. Date: Dec. 4, 2008

(65) Prior Publication Data
US 2010/0139762 A1      Jun. 10, 2010

(30) Foreign Application Priority Data

May 25, 2007  (JP) ................................ 2007-139412

(51) Int. Cl.
*H01L 21/00* (2006.01)

(52) U.S. Cl. ........... 257/43; 438/479; 438/482; 438/488
(58) Field of Classification Search ........... 118/723 ME, 118/723 MW, 723 MR, 723 MA; 438/46, 438/47, 104, 479–481, 482, 485, 486, 488; 257/43
See application file for complete search history.

(56) References Cited

U.S. PATENT DOCUMENTS

| | | | | |
|---|---|---|---|---|
| 4,971,832 | A * | 11/1990 | Arai et al. ...................... | 427/575 |
| 5,976,257 | A * | 11/1999 | Kanai et al. .................... | 118/718 |
| 6,189,484 | B1 * | 2/2001 | Yin et al. ..................... | 118/723 I |
| 2005/0005854 | A1 * | 1/2005 | Suzuki .................. | 118/723 MW |

FOREIGN PATENT DOCUMENTS

| | | |
|---|---|---|
| CN | 1576392 A | 2/2005 |
| JP | 2005-033055 A | 2/2005 |
| JP | 2005-093737 A | 4/2005 |
| JP | 2007-066986 A | 3/2007 |

OTHER PUBLICATIONS

Chinese Office action for 200880017389.9 dated Apr. 22, 2011.
International Search Report for PCT/JP2008/058405 dated Aug. 5, 2008.

* cited by examiner

*Primary Examiner* — Richard A. Booth
(74) *Attorney, Agent, or Firm* — Pearne & Gordon LLP

(57) ABSTRACT

An organometal material gas is supplied into a low electron temperature and high density plasma excited by microwaves to form a thin film of a compound on a substrate as a film forming object. In this case, the temperature of a supply system for the organometal material gas is controlled by taking advantage of the relationship between the vapor pressure and temperature of the organometal material gas.

34 Claims, 38 Drawing Sheets

| Notation | Zn(MOPD)₂ | DIPZ | DMZn: Zn(CH₃)₂ | DEZn: Zn(C₂H₅)₂ |
|---|---|---|---|---|
| Structure | | H₃C\\HC-Zn-CH/CH₃\\CH₃ / H₃C/ \\CH₃ | H₃C–Zn–CH₃ | H₃C–CH₂\\Zn/H₂C–CH₃ |
| Molecular Formula | C18H30O6Zn | C6H14Zn | C2H6Zn | C4H10Zn |
| Molecular Weight | 407.82 | 151.6 | 95.4 | 123.51 |
| Melting Point | 6°C | — | −29°C | −30°C |
| Density | 1.18 g/ml | — | 1.39 g/ml @ 10.5°C | 1.21 g/ml @ 20°C |
| Appearance | Pale Yellow Liquid | Colorless Liquid | Colorless Liquid | Colorless Liquid |

FIG. 6

FIG. 12 anneal condition: argon atmosphere, 60min

| anneal temp | as Depo | 600°C | 700°C |
|---|---|---|---|
| Top view of SEM (×80k) | | | |
| Cross view of SEM (×80k) | | | |
| (002)RC_FWHM | 0.36° | 0.31° | 0.35° |
| mobility | 23 cm²/V·s | | 46 cm²/V·s |
| Carrier concentration | | | |

DMZ : 0.05cc,  Ar/O2=100cc/200cc,  2Torr,  1500W

| Notation | Ga(MOPD)₃ | Ga(CH₃)₃ | Ga(C₂H₅)₃ |
|---|---|---|---|
| Structure | | | |
| Molecular Formula | C27H45GaO9 | C3H9Ga | C6H15Ga |
| Molecular Weight | 583.36 | 114.83 | 156.91 |
| Melting Point | −16°C | −15.8°C | −82.3°C |
| Density | | 1.15g/ml@15°C | 1.06g/ml@20°C |
| Appearance | Pale Yellow Liquid | Colorless Liquid | Colorless Liquid |

FIG. 14

| Kind | | MO-based Material | | Gas |
|---|---|---|---|---|
| Zn Material | | DMZn・DEZn・DIPZn・Zn(MOPD)2 | | |
| O Material | | ※1 | | $O_2$, $H_2O$ |
| N-type Doping Material | Ga | TMGa・TEGa・Ga(MOPD)3 | ※1 | |
| | Al | TMAl・TEAl・Al(MOPD)3 | ※1 | |
| P-type Doping Material | N | | ※1 | $N_2$, NO, $NO_2$, $N_2O$, $NH_4$ |
| | As | | ※1 | $AsH_3$ |
| | P | | ※1 | $PH_3$ |
| Mixed Crystal Material | Mg | (C5H5)2Mg | ※1 | |
| | Cd | | ※1 | |
| | Mn | | ※1 | |

MOPD: methoxy propane diketone

※1: may be incorporated into a molecule of a MO-based material of Zn.

FIG. 19

| Kind | | MO-based Material | Gas |
|---|---|---|---|
| Ga Material | | TMGa・TEGa・Ga(MOPD)3 | |
| N Material | | | $N_2$, NO, $NO_2$, $N_2O$, $NH_4$ |
| N-type Doping Material | Si | ※1 | $SiH_4$ |
| | | ※1 | |
| P-type Doping Material | Mg | $(C_5H_5)_2Mg$ | ※1 |
| | | ※1 | |
| Mixed Crystal Material | Al | TMAl・TEAl・Al(MOPD)3 | ※1 |
| | In | TMIn・TEIn・In(MOPD)3 | ※1 |

MOPD: methoxy propane diketone   ※1: may be incorporated into a molecule of a MO-based material of Ga.

FIG. 20

SEM Image of Surface of ZnO Film grown on ZnO Substrate

| RF Bias (40MHz) | No | Yes |
|---|---|---|
| Top view of SEM Image (80K) |  |  |

Stage Temperature =400°C, Microwave Power =1500W, Pressure =2Torr,

Relationship between Properties of ZnO Film formed on a-plane Sapphire Substrate and Stage Temperature

| Stage (°C) | 400°C | 500°C | 550°C |
|---|---|---|---|
| Top view of SEM Image (80K) Substrate: Sapphire |  |  |  |
| XRC(002) | 0.52° | 0.41° | 0.39° |
| Mobility | 28cm²/V·s | 41cm²/V·s | 34cm²/V·s |

COMPOUND-TYPE THIN FILM, METHOD OF FORMING THE SAME, AND ELECTRONIC DEVICE USING THE SAME

TECHNICAL FIELD

This invention relates to a method of forming a compound-type thin film and to the thin film formed by such a method. Further, this invention relates to electronic devices including a light-emitting device, a solar cell, a TFT, other general semiconductor devices, a flat-panel display device, and so on each having such a thin film.

BACKGROUND ART

Conventionally, a compound-type semiconductor thin film is formed on a substrate for manufacturing a semiconductor light-emitting device. In terms of the need for a reduction in light emission wavelength of the semiconductor light-emitting device, there has been a demand for forming such a thin film with high crystallinity and high quality from a material with a large band gap energy. Further, in a display element, a display device, a solar cell, and a semiconductor light-emitting device, a transparent conductive thin film is used. There has been a demand for forming such a thin film at a low temperature in terms of a problem of heat resistance of a substrate.

On the other hand, such a transparent conductive thin film often contains indium as a constituent element. However, there is a possibility of depletion of indium as resources and thus there has been a demand for a thin film (conductive thin film) containing no indium.

Patent Document 1 proposes to use a zinc oxide (ZnO)-based material as a thin film containing no indium. Patent Document 1 further discloses a remote plasma-excited MOCVD (Metal Organic Chemical Vapor Deposition) apparatus that uses a plasma. The remote plasma-excited MOCVD apparatus shown in Patent Document 1 is such that a plasma generating section and a transport section are added to a conventional MOCVD apparatus, thereby introducing radicals into the reaction process to promote decomposition of an organic metal, thus enabling the growth of a crystal at a low temperature.

To explain more specifically, the remote plasma-excited MOCVD apparatus shown in Patent Document 1 converts oxygen ($O_2$), hydrogen ($H_2$), or the like into a plasma and uses it for a thin film growing reaction. Therefore, a plasma generator as the plasma generating section is disposed in a place different from that of a stainless chamber serving as a reaction container and converts oxygen, hydrogen, or helium into a plasma. Among generated ions, electrons, radicals, and light, neutral atomic radicals with a relatively long lifetime are transported to the stainless chamber and used for a decomposition reaction of a material.

Patent Document 1: JP-A-2007-66986

DISCLOSURE OF THE INVENTION

Problem to be Solved by the Invention

However, according to this structure, since the plasma generator is disposed in the place different from that of the reaction chamber and thus the place of radical generation is away from a substrate in the reaction chamber, the amount of arriving radicals is small so that the reactivity is poor. Therefore, it is difficult to form a high-quality thin film on a film forming object over a wide area thereof using the remote plasma-excited MOCVD apparatus shown in Patent Document 1. Thus, Patent Document 1 does not take into account to improve the light emission efficiency of a semiconductor light-emitting device or the electric field effect mobility of a transistor.

On the other hand, in electronic devices including a semiconductor light-emitting device and a semiconductor device having a thin film, it is required to improve the light emission efficiency of the semiconductor light-emitting device and to improve the electric field effect mobility of the semiconductor device.

It is a technical object of this invention to provide a stable thin film for a semiconductor light-emitting device, which can be formed with high crystallinity, high quality, and high reproducibility, and to provide a semiconductor light-emitting device having such a thin film.

It is another technical object of this invention to provide a stable thin film for a semiconductor device, which has a high mobility and a controlled electrical conductivity and can be formed with high reproducibility, and to provide a semiconductor device having such a thin film in a channel region.

In electronic devices such as a solar cell, a display device, a display element, and a light-emitting device, it is also required to improve the use efficiency of light.

It is therefore another technical object of this invention to provide a stable transparent conductive film for an electronic device such as a solar cell, a display device, a display element, or a light-emitting device, which can be formed transparent with a low resistance and high reproducibility, and to provide an electronic device such as a solar cell, a display device, a display element, or a light-emitting device having such a conductive film.

The thin film and the electronic device having such a thin film are preferably manufactured at a low temperature. Therefore, it is another technical object of this invention to provide a stable thin film for an electronic device, which can be formed with high quality and high reproducibility at a low temperature, and to provide an electronic device having such a thin film.

Further, it is another technical object of this invention to provide methods of manufacturing such a thin film and such an electronic device.

Means for Solving the Problem

This invention can have the following configurations.

(First Aspect)

According to this invention, there is provided a thin film forming method comprising supplying a gas containing at least an organometallic material gas into a plasma generated using a microwave-excited high-density plasma generator, thereby forming, on a film forming object, a thin film of at least one of a II-VI group compound, a III-V group compound, and a IV group compound.

Herein, the gas according to this invention contains a plasma excitation gas, a reactive gas, and a material gas. Among them, the plasma excitation gas contains a noble gas such as Ar, Kr, Xe, or He and the reactive gas contains a gas such as $O_2$, $NH_3$, or $H_2$. Further, the material gas contains a gas such as $N_2$, NO, $N_2O$, $NH_3$, $AsH_3$, $PH_3$, or $B_2H_6$. For example, in the case of growing a ZnO-based thin film, use is made of an organometallic material gas containing Zn, one of plasma excitation gases: Ar, Kr, Xe, and He, and a reactive gas: $O_2$ or the like. In order to form a p-type ZnO film, when N is used as a dopant, $N_2$, NO, $N_2O$, $NH_3$, or the like is simultaneously caused to flow, when As is used as a dopant, $AsH_3$ is used, or when P is used as a dopant, $PH_3$ is simultaneously caused to flow. When Ga or Al for forming an n-type ZnO film is used as a dopant, an organometallic material gas containing Ga or Al is simultaneously caused to flow. At least one of the reactive gas and the material gas may be used as a plasma excitation gas.

(Second Aspect)

A method according to the first aspect, comprising applying a bias potential to the film forming object to irradiate ions in the plasma onto a surface of the film.

(Third Aspect)

A method according to the second aspect, comprising setting the bias potential to be applied to −0.1V to −30V.

(Fourth Aspect)

A method according to the second aspect, comprising setting the bias potential to be applied to −30V or less (absolute value is 30 or more).

(Fifth Aspect)

A method according to the second aspect, comprising setting the bias potential to be applied to a potential that causes a half-width, obtained by X-ray diffraction measurement, of the formed thin film to be reduced as compared with a case of no bias potential application.

(Sixth Aspect)

A method according to the second aspect, comprising setting the bias potential to be applied to a potential that causes a mobility of the formed thin film to be increased as compared with a case of no bias potential application.

(Seventh Aspect)

A method according to the second aspect, comprising setting the bias potential to be applied to a potential that causes a concentration of impurities contained in the formed thin film to be reduced as compared with a case of no bias potential application.

(Eighth Aspect)

A method according to the second aspect, comprising setting the bias potential to be applied to a potential that causes a photoluminescence property of the formed thin film to be improved as compared with a case of no bias potential application.

(Ninth Aspect)

A method according to the eighth aspect, comprising setting the bias potential to be applied to a potential that causes an intensity of band-edge luminescence peculiar to a material of the formed thin film in photoluminescence property to be increased and further causes luminescence intensities of deep levels to be reduced as compared with a case of no bias potential application.

(Tenth Aspect)

A method according to the second aspect, comprising setting the bias potential to be applied to a potential that causes a flatness of a film structure of the formed thin film to be improved as compared with a case of no bias potential application.

(Eleventh Aspect)

A method according to any one of the first to tenth aspects, comprising using, as the organometallic material gas, an organometallic gas containing at least one of elements of the II group, the III group, the IV group, the V group, and the VI group.

(Twelfth Aspect)

A thin film of a II-VI group compound, a III-V group compound, or a IV group compound formed using the thin film forming method according to any one of the first to tenth aspects.

(Thirteenth Aspect)

A thin film according to the twelfth aspect, wherein the thin film has a conductivity.

(Fourteenth Aspect)

A thin film according to the twelfth or thirteenth aspect, wherein the thin film is transparent.

(Fifteenth Aspect)

A thin film according to any one of the twelfth to fourteenth aspects, wherein the thin film is single-crystalline.

(Sixteenth Aspect)

A thin film according to any one of the twelfth to fourteenth aspects, wherein the thin film is polycrystalline.

(Seventeenth Aspect)

A thin film according to any one of the twelfth to fourteenth aspects, wherein the thin film is amorphous.

(Eighteenth Aspect)

A thin film according to any one of the fifteenth to seventeenth aspects, wherein the thin film is formed on a glass substrate.

(Nineteenth Aspect)

A thin film according to the sixteenth or seventeenth aspect, wherein the thin film is formed on a resin substrate.

(Twentieth Aspect)

A thin film according to any one of the fifteenth to seventeenth aspects, wherein the thin film is formed using a substrate that can bear a temperature of 500° C. or more.

(Twenty-First Aspect)

A thin film according to any one of the twelfth to twentieth aspects, wherein the thin film contains no indium as a constituent element.

(Twenty-Second Aspect)

A semiconductor light-emitting device comprising the thin film according to any one of the twelfth to twenty-first aspects.

(Twenty-Third Aspect)

A solar cell comprising the thin film according to any one of the twelfth to twenty-first aspects.

(Twenty-Fourth Aspect)

An electronic device comprising the thin film according to any one of the twelfth to twenty-first aspects, which is transparent and conductive.

(Twenty-Fifth Aspect)

A semiconductor device using the thin film according to any one the twelfth to twenty-first aspects as a channel region.

(Twenty-Sixth Aspect)

An electronic device comprising the thin film according to the nineteenth or twenty-first aspect and using a resin substrate of a material with a heat resistance temperature of 200° C. or less.

(Twenty-Seventh Aspect)

A thin film forming apparatus comprising a microwave-excited high-density plasma generator and a supply system for supplying a gas containing an organometallic material gas into a plasma generated in the microwave-excited high-density plasma generator, the supply system being temperature-controlled using a relationship between a vapor pressure and a temperature of the organometallic material gas.

(Twenty-Eighth Aspect)

A thin film forming apparatus according to the twenty-seventh aspect, comprising applying a bias potential to a film forming object to irradiate ions in the plasma onto a surface of a film.

Effect of the Invention

According to this invention, making use of a low-electron-temperature high-density plasma excited by a microwave, a large amount of radicals arriving at a diffusion region separated from an excitation region is used in the process of reaction with a material gas so that it is possible to form, with high quality, a thin film of a II-VI group compound, a III-V group compound, or a IV group compound on a film forming object over a wide area thereof.

Therefore, according to this invention, it is possible to provide a stable thin film with high crystallinity and high quality, a semiconductor light-emitting device having such a thin film, and a thin film forming method.

Further, according to this invention, it is possible to provide a stable thin film with a high mobility and a controlled electrical conductivity, a semiconductor device having such a thin film in a channel region, and a thin film forming method.

Further, according to this invention, it is possible to provide a stable transparent conductive thin film with a low resistance, an electronic device having such a thin film, and a thin film forming method.

Further, according to this invention, it is possible to provide a high-quality thin film formed at a low temperature, an electronic device having such a thin film, and a thin film forming method. Therefore, a substrate of the electronic device can be formed of glass, resin, or the like.

Further, according to this invention, it is possible to provide an electronic device such as a high-efficiency light-emitting device, a high-efficiency solar cell, a bright easy-to-see display device or display element with low power consumption, or a solar cell, a display device, a display element, a light-emitting device, or a semiconductor device comprising a flexible substrate or the like made of a low heat resistance material, and to provide a thin film forming method.

BRIEF DESCRIPTION OF THE DRAWINGS

FIG. 6 is a diagram for explaining organometallic materials of Zn one of which was used in FIG. 5.

FIGS. 9(a), (b), and (c) are diagrams showing the film forming condition dependence of the crystallinity of a ZnO film formed on a glass substrate, wherein FIG. 9(a) shows the dependence on the microwave power, FIG. 9(b) shows the dependence on the oxygen flow rate, and FIG. 9(c) shows the dependence on the stage temperature.

FIG. 12 is a diagram for explaining an effect of annealing of a ZnO film.

FIG. 14 is a diagram for explaining organometallic materials of Ga.

FIG. 19 is a diagram showing examples of materials for use in ZnO-based compound thin film formation.

FIG. 20 is a diagram showing examples of materials for use in GaN-based compound thin film formation.

FIGS. 32(a) and (b) are diagrams showing Example 1 about the control of a bias potential by radio-frequency power application, wherein FIG. 32(a) is a diagram for explaining a measurement method of a self-bias potential Vdc and FIG. 32(b) is a diagram showing an example 1 of self-bias potential measurement results.

FIGS. 33(a) and (b) are diagrams showing Example 2 about the control of a bias potential by radio-frequency power application, wherein FIG. 33(a) shows an example of a stage that suppresses the power per unit area and FIG. 33(b) is a diagram showing an example 2 of self-bias potential measurement results.

BEST MODE FOR CARRYING OUT THE INVENTION

Hereinbelow, embodiments of this invention will be described with reference to the drawings.

Figure 1:
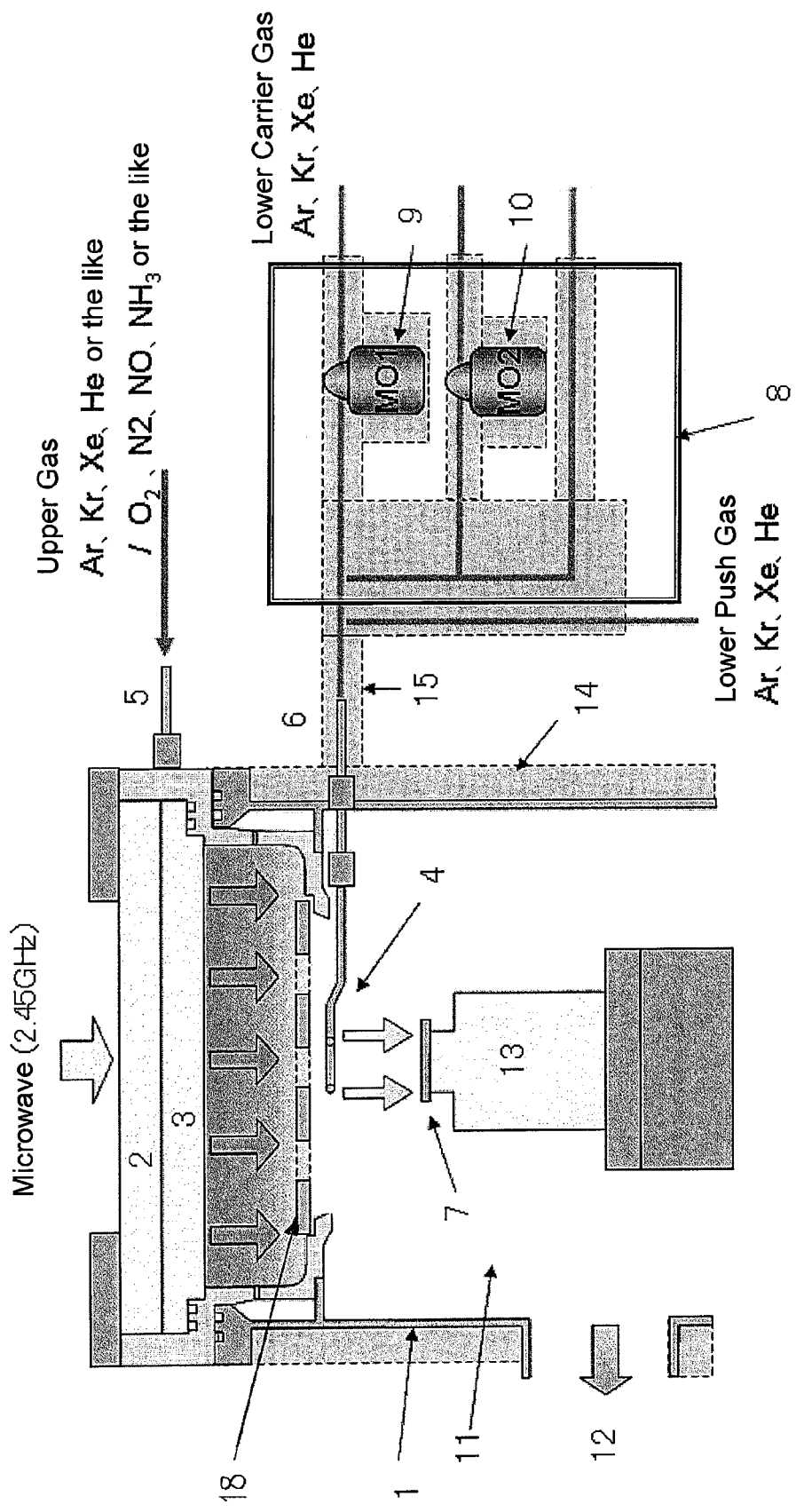
FIG. 1 is a sectional view showing a schematic structure of a plasma processing apparatus according to a first embodiment of this invention.

FIG. 1 is a schematic sectional view showing a plasma processing apparatus according to a first embodiment of this invention. The illustrated plasma processing apparatus 1 is a microwave-excited high-density plasma processing apparatus and has a process chamber 11. The process chamber 11 is provided therein with a dielectric plate 2, an upper shower plate 3, a lower shower nozzle 4, and a stage 13. A processing substrate (film forming object) 7 is placed on the stage 13. Slightly above the lower shower nozzle 4, a partition plate 18 with one or more openings is disposed.

Herein, a microwave is transmitted through the dielectric plate 2 and the shower plate 3 and radiated into a plasma generation region in the upper part of the process chamber of the plasma processing apparatus 1. An Ar gas (alternatively, Kr gas, Xe gas, or He gas) as a plasma excitation gas is supplied to the upper shower plate 3 through a gas introduction pipe 5 and uniformly ejected from the upper shower plate 3 into the plasma generation region. The microwave is radiated into the plasma generation region as described above and thus a plasma is excited in the plasma excitation gas by the microwave and introduced from the plasma generation region into a plasma diffusion region and to the lower shower nozzle 4 disposed in the plasma diffusion region.

Herein, the plasma excitation gas such as Xe, Kr, He, or Ar and a reactive gas such as $O_2$, $N_2$, NO, or $NH_3$ are introduced into the upper shower plate 3 through the introduction pipe 5, while, an organometallic material gas is caused to flow into the lower shower nozzle 4 through an introduction pipe 6 so that a compound thin film can be formed on a surface of the substrate 7.

The illustrated plasma processing apparatus 1 has an organometallic material supply system 8 for supplying an organometallic material. In the organometallic material supply system 8, one or a plurality of MO containers 9 and 10 are provided. An organometallic material is sent to the lower shower nozzle 4 from the MO container 9, 10 through the introduction pipe 6.

An exhaust gas in the process chamber 11 passes through an exhaust duct via an exhaust system 12 (only an exhaust port is shown with illustration of an exhaust structure being omitted) and then is introduced into a small exhaust pump.

The diameter of the illustrated process chamber 11 is 240 mm and the stage 13 with a diameter of 33 mm is disposed therein for placing the substrate 7 thereon. The illustrated stage 13 can be moved upward and downward by motor drive so that the substrate 7 can be arranged at an optimal height position. The stage 13 is provided with a structure in which a heater is incorporated for heating the substrate 7 to control it at a desired temperature.

A wall surface of the plasma processing apparatus 1 shown in FIG. 1 is temperature-controlled at, for example, 100° C. by a heater 14 for suppressing adhesion of reaction products. Further, a gas pipe extending from the organometallic material supply system 8 to a forward end portion of the shower nozzle is temperature-controlled at a temperature not less than that of each material container.

The dielectric plate 2 disposed in the upper part of the process chamber 11 has a diameter of 251 mm and a thickness of 15 mm and the upper shower plate 3 has a diameter of 251 mm and a thickness of 30 mm. Materials of these dielectric plate 2 and upper shower plate 3 are both an alumina ceramic.

Figure 2:
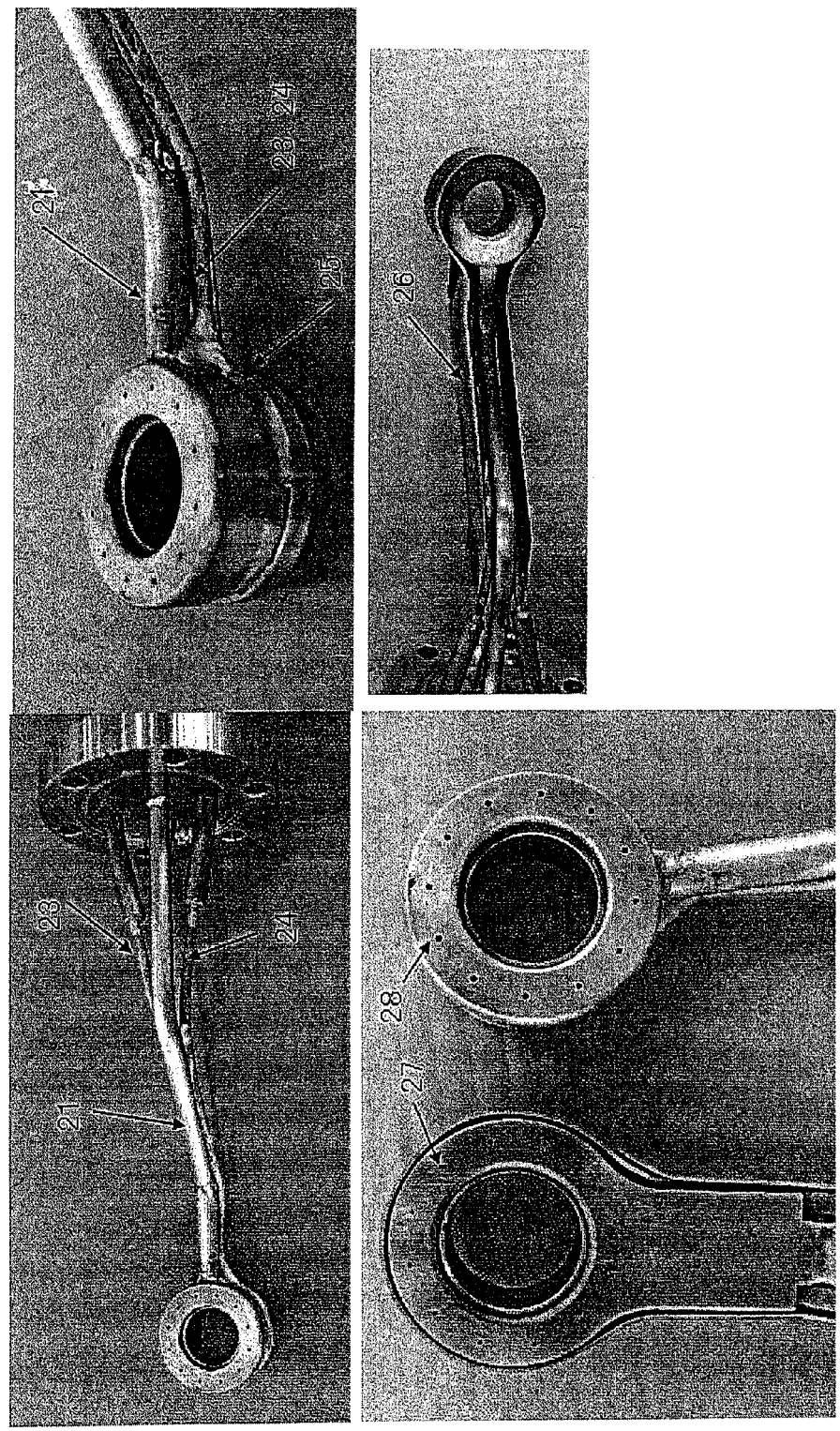
FIG. 2 is a diagram for explaining a lower shower nozzle in the plasma processing apparatus shown in FIG. 1.

FIG. 2 shows an example of the lower shower nozzle 4. The illustrated lower shower nozzle 4 comprises a gas pipe 21 for sending a gas containing an organometallic material, and a temperature control liquid pipe (for going) 23 and a temperature control liquid pipe (for return) 24 for controlling the temperature of the shower nozzle. Further, the lower shower nozzle 4 is provided with a thermocouple 25 for measuring the temperature of the shower nozzle and a cover 26 covering the whole. A lower surface of the forward end portion of the lower shower nozzle 4 is provided with a plurality of small holes for uniformly ejecting a gas, for example, holes 27 having a diameter of 0.5 mm or holes 28 having a diameter of 0.7 mm. The forward end portion of the shower nozzle has a ring shape with an outer diameter of 33 mm and an inner diameter of 17 mm.

Figure 3:
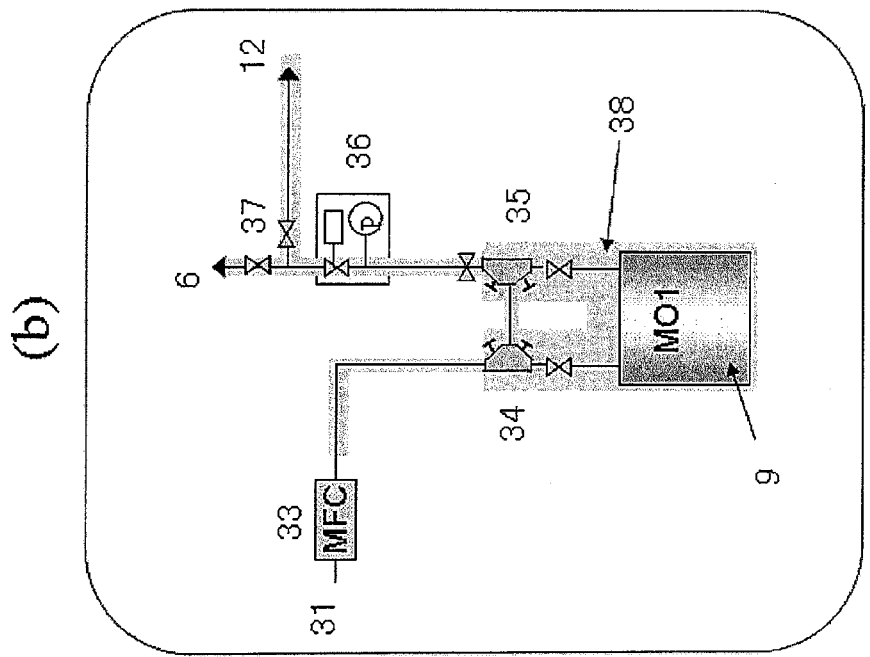
FIGS. 3(a) and (b) are diagrams for explaining an organometallic material supply system in the plasma processing apparatus shown in FIG. 1.
Figure 3:
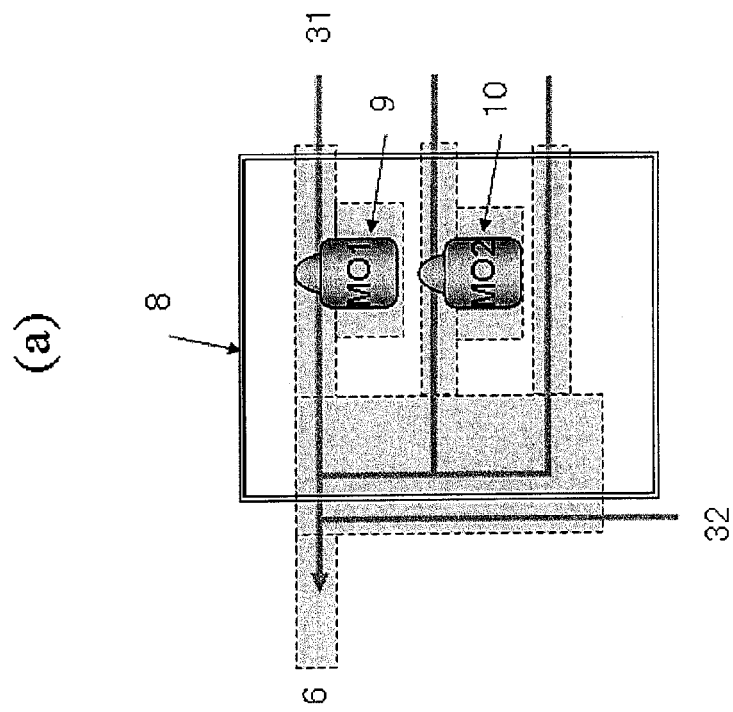

FIGS. 3(a) and (b) show an example of the organometallic material supply system 8. Of them, in FIG. 3(a), an Ar gas (alternatively Kr gas, Xe gas, or He gas) is used as a carrier gas 31 that passes through the MO container 9, 10, containing the organometallic material, to reach the introduction pipe 6, and as a push gas 32 for uniformly ejecting a gas from the shower nozzle.

On the other hand, FIG. 3(b) shows in detail a container portion including the MO container 9. In FIG. 3(b), the carrier gas 31 is adjusted to a desired flow rate by a flow rate controller (MFC) 33 and then passes through the MO container 9 to reach the introduction pipe 6. The MO container 9 is controlled at a desired pressure and temperature by a pressure regulator 36 and a temperature control system 38. Valves 34, 35, and 37 are provided in gas piping and the gas flow path can be switched by these valves 34, 35, and 37.

Figure 4:
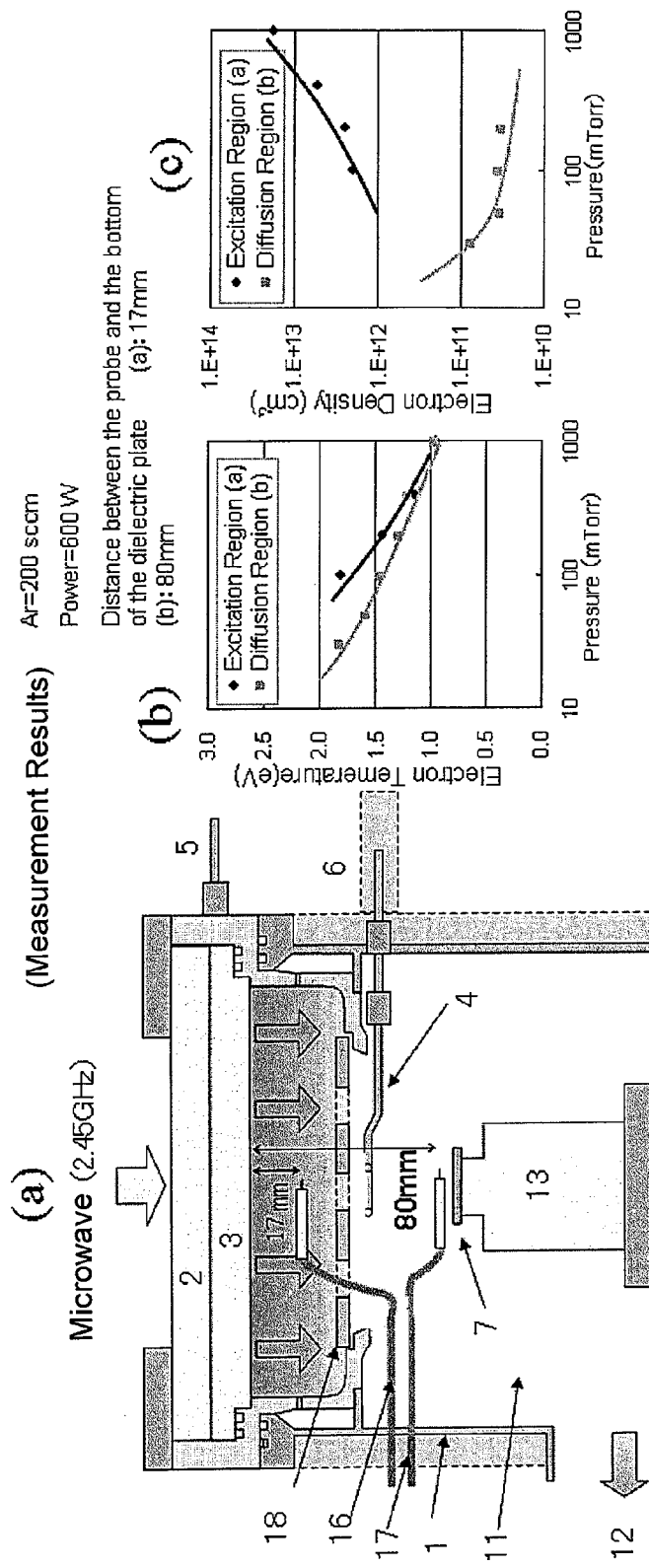
FIGS. 4(a), (b), and (c) are diagrams showing a measurement method of the plasma properties of the plasma processing apparatus shown in FIG. 1 and an example of the measurement results thereof.

Referring to FIG. 4(a) to (c), the plasma properties of the plasma processing apparatus will be explained along with its measurement method. First, as shown in FIG. 4(a), the measurement of the plasma properties was performed by inserting probes 16 and 17 into the excitation region and the diffusion region in the process chamber 11, respectively. As a result of this measurement, it was found that the electron temperature was a low electron temperature of 1 eV to 2 eV as shown in FIG. 4(b) and the electron density was a high density of E12 (i.e. $1 \times 10^{12}$) or more in the excitation region as shown in FIG. 4(c). The electron density over the substrate 7 can be controlled by the opening ratio of the partition plate 18.

Next, the film forming process of a ZnO-based compound thin film according to this invention will be described in detail.

Figure 5:
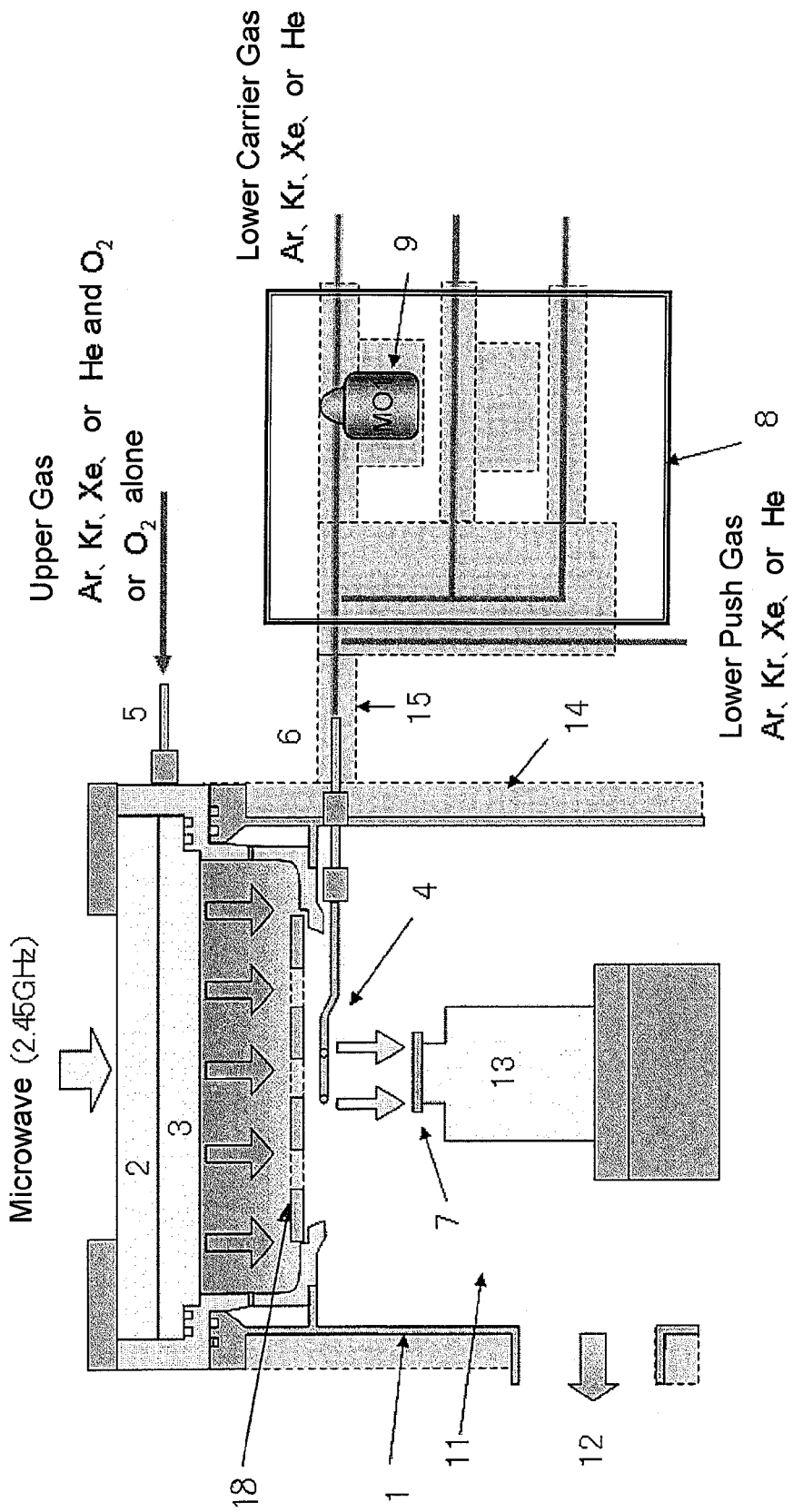
FIG. 5 is a schematic diagram for explaining an example of forming a ZnO-based compound thin film by the plasma processing apparatus shown in FIG. 1.

Referring to FIG. 5, in the ZnO film forming process according to this invention, a ZnO film is formed using an organometallic material containing Zn and an Ar plasma added with $O_2$. Kr, Xe, or He may be used instead of the Ar plasma.

Figure 7:
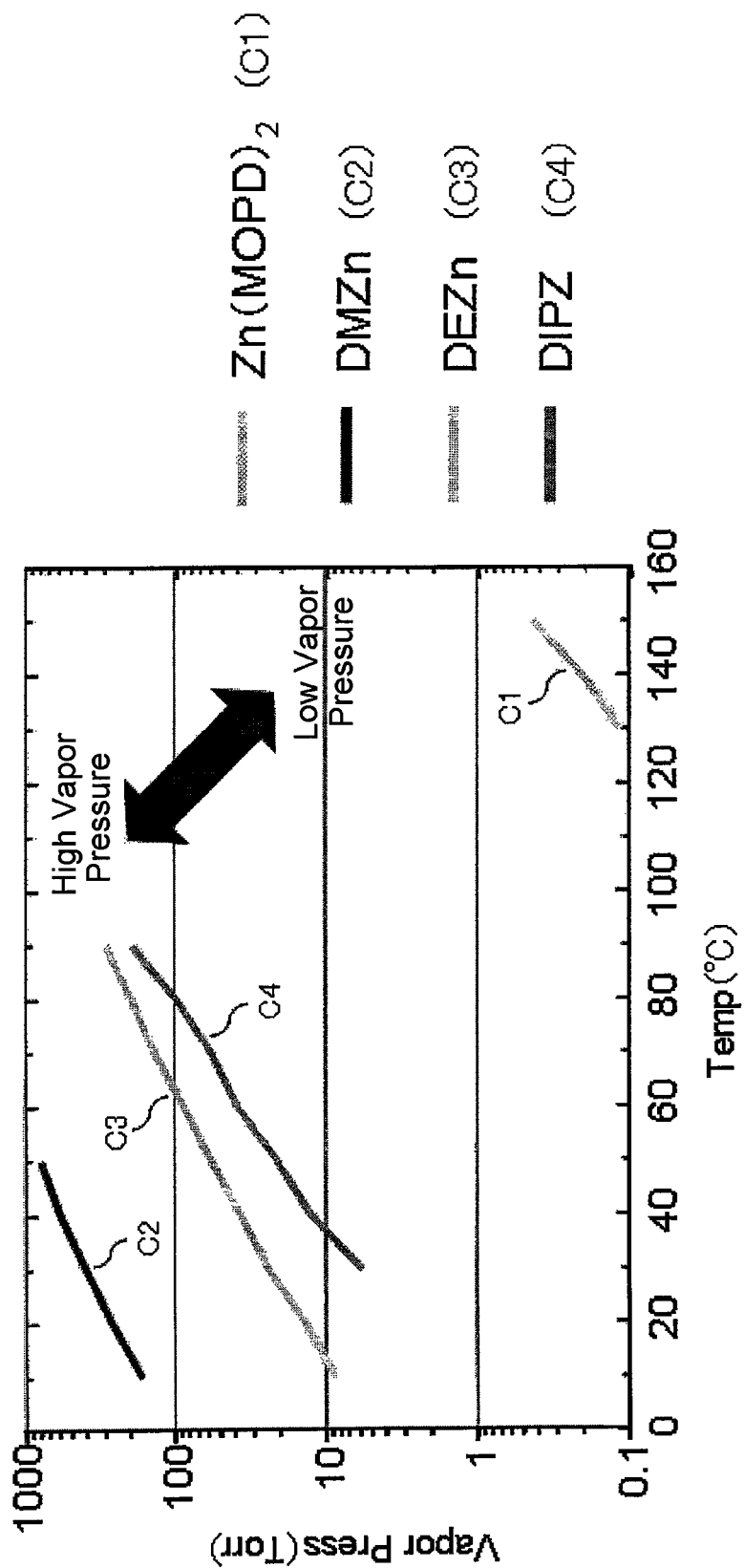
FIG. 7 is a graph showing the vapor pressure properties of the organometallic materials of Zn shown in FIG. 6.

Herein, as shown in FIG. 6, $Zn(MOPD)_2$, DIPZ, DMZn, or DEZn was used as the organometallic material of Zn. In FIG. 7, the vapor pressure properties of the respective materials {$Zn(MOPD)_2$, DMZn, DEZn, and DIPZ} are shown by curves C1, C2, C3, and C4, respectively. As shown in FIG. 7, the organometallic material gases change in vapor pressure depending on the temperature. Therefore, for controlling the material supply amount into the process chamber 11, it is necessary to control the temperature of the organometallic material supply system 8 and the temperature of the lower shower nozzle 4. Further, it is also necessary to take into account that the organometallic material gases are decomposed by heat.

In this embodiment, the temperature of the supply system and the temperature of the gas pipe are adjusted in film formation depending on the organometallic material gas. That is, according to the vapor pressure-temperature characteristics of the organometallic material gas, the temperature control is implemented so that a positive temperature gradient is formed from the MO container 9, containing the organometallic material (in this embodiment, the organometallic material containing Zn), to the lower shower nozzle 4. In this case, the temperature from the MO container 9 to the lower shower nozzle 4 is controlled to be not more than a decomposition temperature of the organometallic material gas. Further, for preventing the temperature rise due to plasma irradiation, the lower shower nozzle 4 is provided with the coolant flow paths 23 and 24 and the thermocouple 25 as described in FIG. 2. Although not illustrated, a coolant flow path is provided also in the ring-shaped portion of the lower shower nozzle 4 and connected to the coolant flow paths 23 and 24.

With the structure described above, if a Xe, Kr, He, or Ar gas and $O_2$ are caused to flow into the upper shower plate 3 through the introduction pipe 5 and the organometallic material gas containing Zn is caused to flow into the lower shower nozzle 4 through the introduction pipe 6, a ZnO film can be formed on the substrate 7, for example, a glass surface or a wafer surface.

Figure 8:
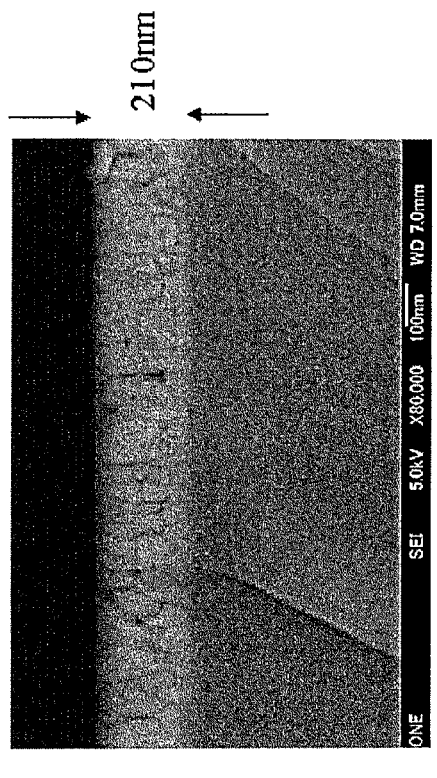
FIG. 8 is a diagram showing an example of a ZnO film formed on a glass substrate.
Figure 8:
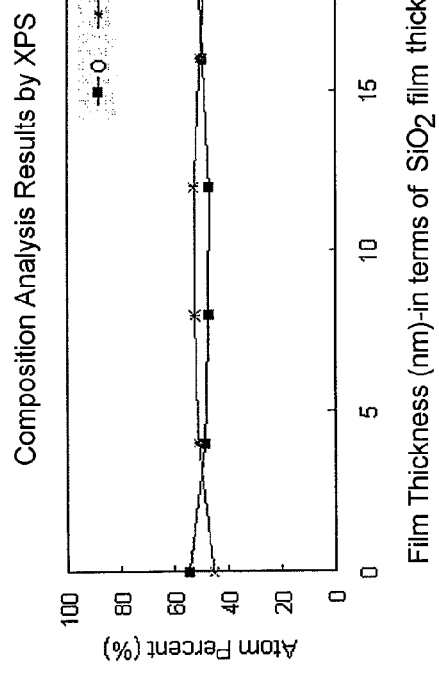

FIG. 8 shows an example of forming a ZnO film on a glass substrate. In this example, $Zn(MOPD)_2$ was used as a Zn material. As clear from the results of composition analysis by XPS (X-ray photoelectron spectroscopy), the film composition is such that zinc (Zn) and oxygen (O) are in approximately 1:1. Further, FIG. 8 also shows a SEM (scanning electron microscope) image of a section of the film. This film is a polycrystalline film.

Figure 9:
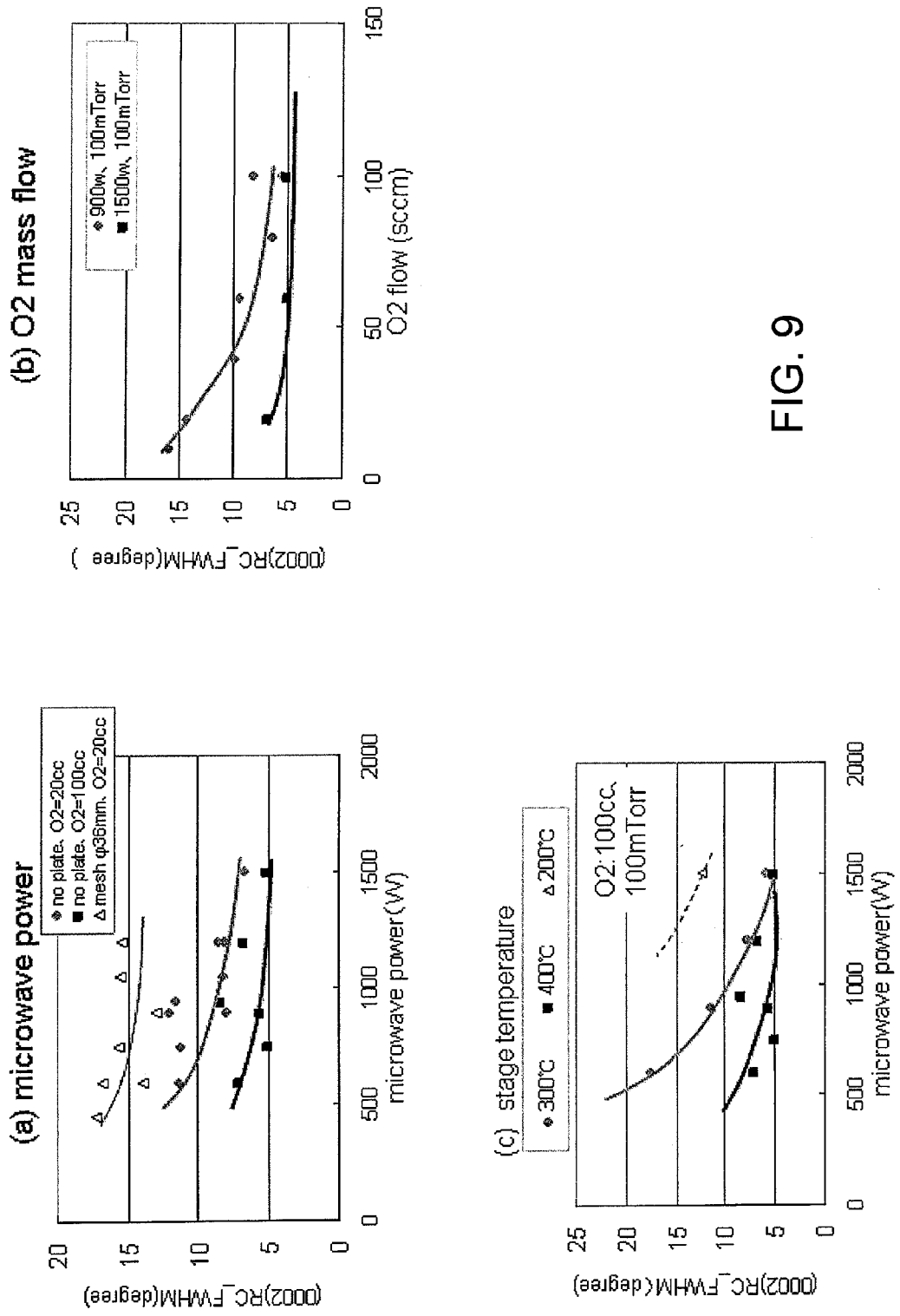

Referring to FIG. 9 (a) to (c), there is shown the film forming condition dependence of the crystallinity of a ZnO film formed on a glass substrate, wherein FIG. 9 (a) shows the relationship between the microwave power and the ZnO crystallinity, FIG. 9 (b) shows the relationship between the oxygen flow rate and the ZnO crystallinity, and FIG. 9 (c) shows the relationship between the stage temperature and the ZnO crystallinity. Also in this example, $Zn(MOPD)_2$ was used as a Zn material. The crystallinity is judged such that the smaller the half-width of the X-ray diffraction (XRD) rocking curve of the (002) plane, the higher the crystallinity.

With respect to the microwave power condition, the higher power is better and it is preferably 1,000 to 1,500 W. It is better that openings of the partition plate 18 (FIG. 5) partitioning between the excitation region and the diffusion region be wider. This shows that it is important that a large amount of reactive species such as oxygen radicals arrive near a wafer, for improving the crystallinity.

With respect to the oxygen flow rate condition, the higher oxygen flow rate is better. Preferably, it is 50 to 100 sccm. This also shows that it is important that a large amount of reactive species such as oxygen radicals be produced and arrive near a wafer (substrate).

With respect to the stage temperature condition, there was no difference in crystallinity at 300° C. and 400° C. under the conditions of high power and high oxygen flow rate. This means that contribution of oxygen radicals and so on produced using a microwave-excited low-electron-temperature high-density plasma to the reaction is greater than that of heat to the reaction. That is, this suggests that a good thin film can be obtained at a lower temperature as compared with the MOCVD method using only heat. In the case of a stage temperature of 200° C., when the microwave power is set small (e.g. 600 W), there is obtained an amorphous-like film with a weak X-ray diffraction peak and thus a poor crystallinity. Further, when the microwave power is set to a low power (e.g. 600 W) at a stage temperature of 100° C., there is obtained an amorphous film with no X-ray diffraction peak.

Figure 10:
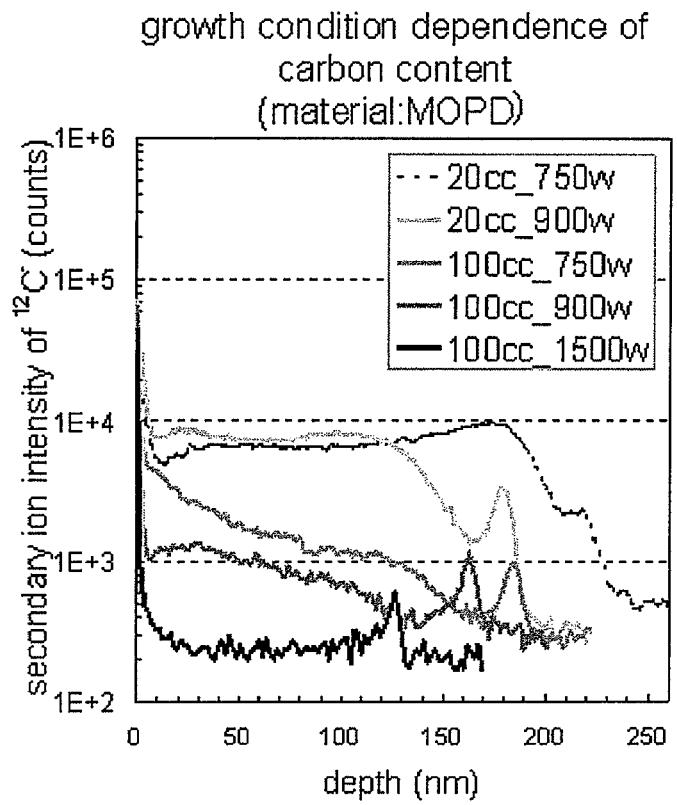
FIG. 10 is a diagram showing the film forming condition dependence of the carbon content of a ZnO film formed on a glass substrate.

Referring to FIG. 10, there is shown the film forming condition dependence of the carbon content of a ZnO film formed on a glass substrate. The carbon amount in the film was measured by SIMS (Secondary Ion Mass Spectrometry) analysis. When the oxygen flow rate is high, the carbon amount decreases depending on the microwave power. It is found that the remaining impurities can be reduced by selection of the conditions in this manner.

Figure 11:
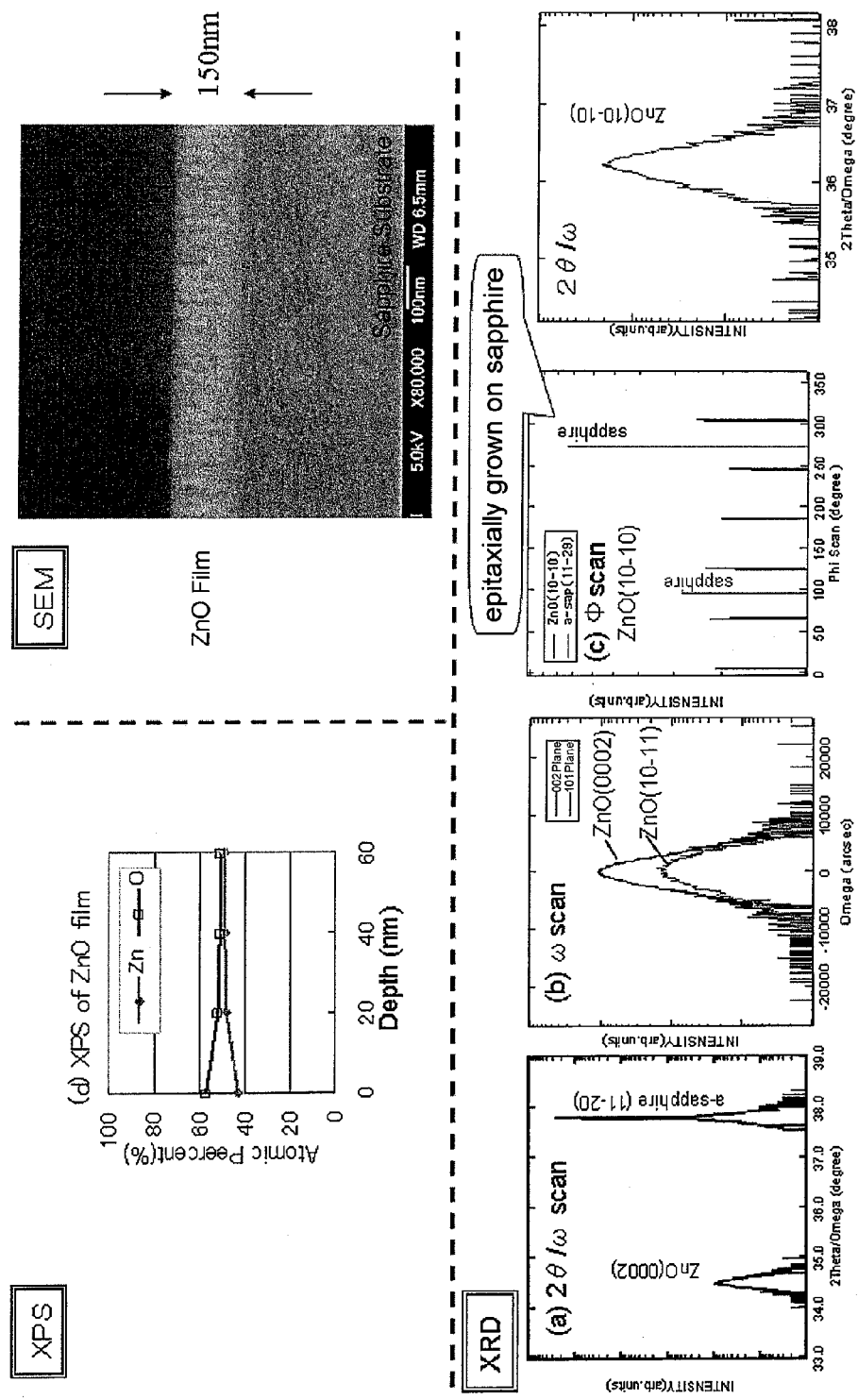
FIG. 11 is a diagram for explaining an example of a ZnO film formed on a sapphire substrate.

Referring to FIG. 11, there is shown an example of a ZnO film formed on an a-plane sapphire substrate. In this case, $Zn(MOPD)_2$ was used as a Zn material. As shown in a column of XPS in FIG. 11, the film composition examined by XPS is such that zinc and oxygen are in approximately 1:1. In a column of SEM in FIG. 11, there is shown a SEM image of a section of the film. Further, from the results of XRD shown in a column of XRD in FIG. 11, it is seen that the film is epitaxially grown on the sapphire substrate.

FIG. 12 shows an effect of improvement in crystallinity by annealing of a polycrystalline ZnO film formed on an a-plane sapphire substrate. DMZ was used as a Zn material. As compared with the state of the film after the formation, the film becomes more continuous laterally by annealing at 600° C. or 700° C. and the value of mobility is also improved.

Next, referring to FIG. 13, the film forming process of a Ga-doped ZnO (i.e. GZO) thin film will be described.

Figure 13:
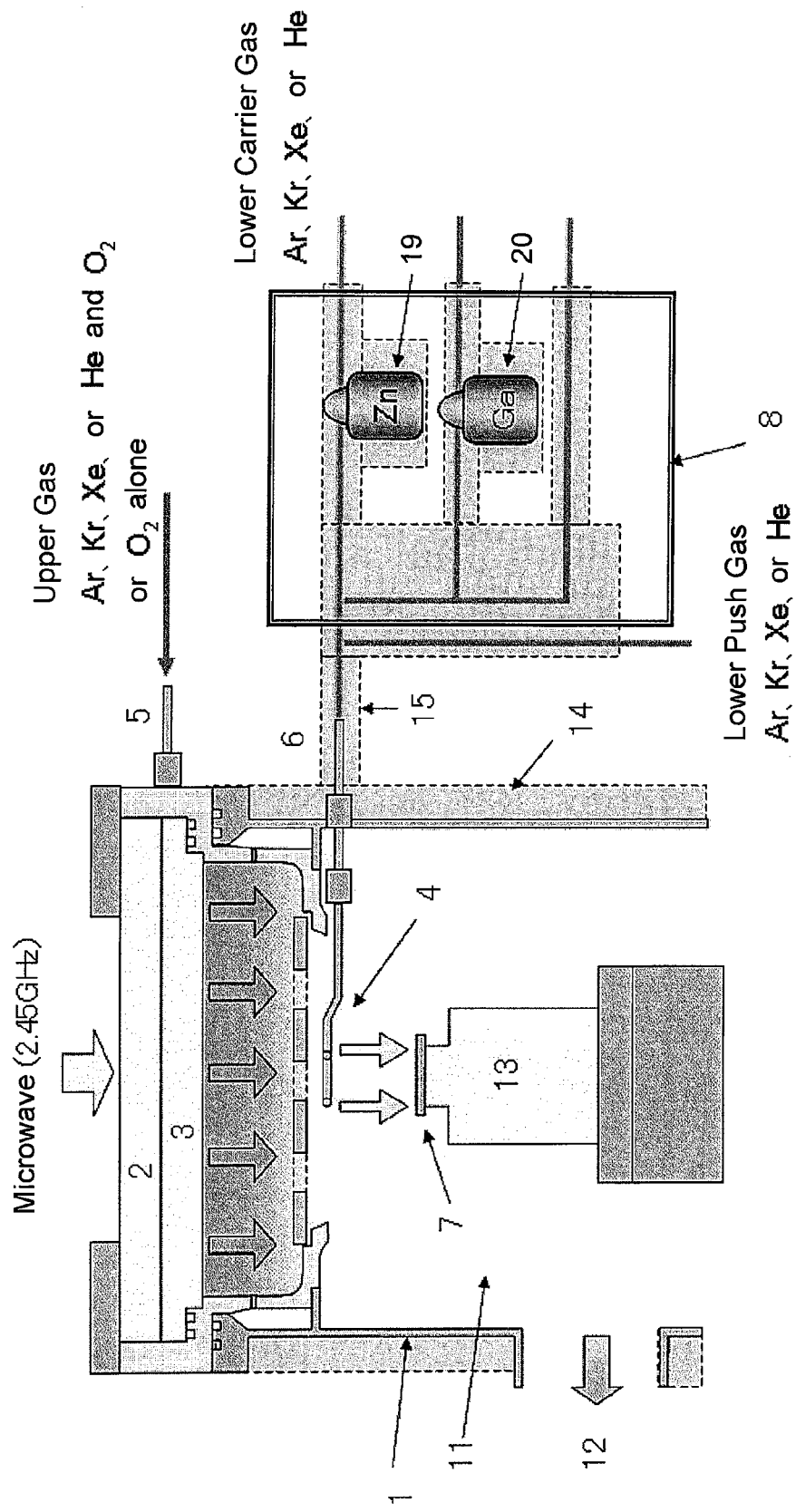
FIG. 13 is a diagram for explaining a case of forming a Ga-doped ZnO thin film using the plasma processing apparatus of this invention.

In FIG. 13, in the GZO film forming process according to this invention, a ZnO film is formed using an organometallic material 19 containing Zn, an organometallic material 20 containing Ga, and an Ar plasma added with $O_2$. Kr, Xe, or He may be used instead of the Ar plasma.

Herein, like in FIG. 6, $Zn(MOPD)_2$, DIPZ, DMZn, or DEZn was used as the organometallic material of Zn. The vapor pressure properties of the respective organometallic materials are shown in FIG. 7. As described referring to FIG. 7, it is necessary to adjust the temperature of the organometallic material supply system 8 and the temperature of its gas pipe in film formation depending on the material.

Figure 15:
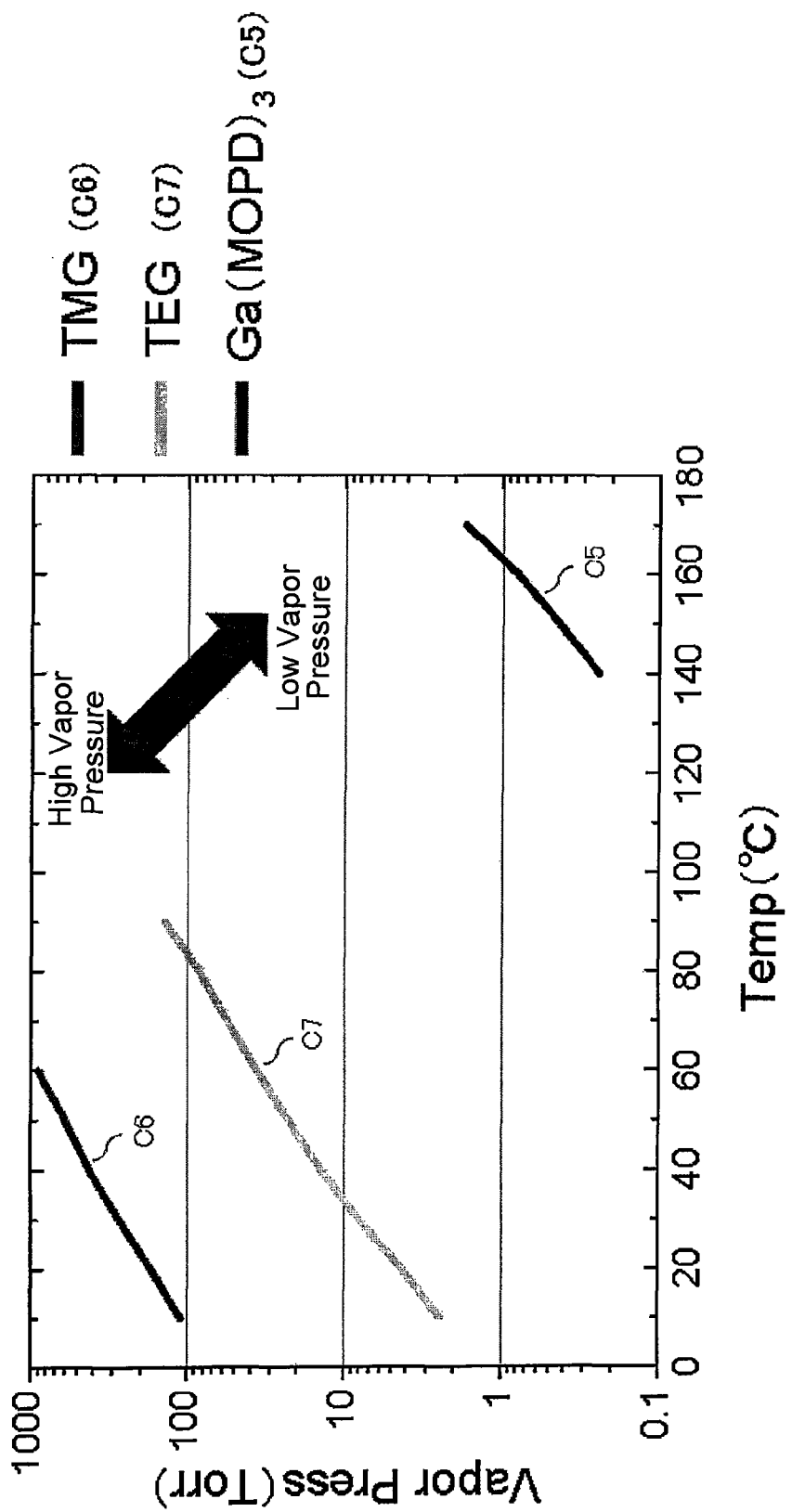
FIG. 15 is a diagram showing the vapor pressure properties of the organometallic materials of Ga.

On the other hand, as shown in FIG. 14, $Ga(MOPD)_3$, $Ga(CH_3)_3$ (i.e. TMG), or $Ga(C_2H_5)_3$ (i.e. TEG) was used as the organometallic material of Ga. In FIG. 15, the vapor pressure properties of these organometallic materials of Ga are shown by curves C5, C6, and C7, respectively. Therefore, it is necessary to adjust the temperature of the supply system and the temperature of its gas pipe in film formation depending on the organometallic material. In this case, as shown in FIG. 13, if a Xe, Kr, He, or Ar gas and $O_2$ are caused to flow into the upper shower plate 3 through the introduction pipe 5 and an organometallic gas containing Zn and Ga is caused to flow into the lower shower nozzle 4 through the introduction pipe 6, a GZO film can be formed on the substrate 7, for example, a glass substrate.

Figure 16:
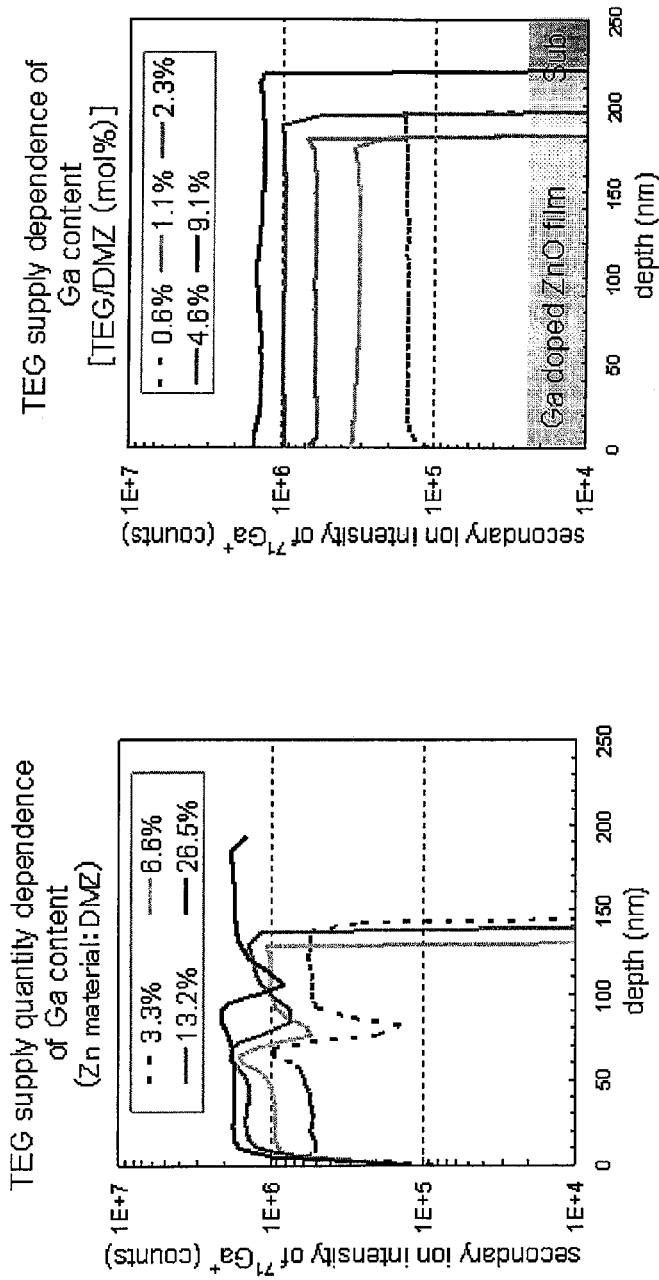
FIG. 16 is a diagram for explaining the TEG supply dependence of the Ga content of GZO films.

FIG. 16 shows, by SIMS data, the Ga contents of GZO films respectively formed on a glass substrate and an a-plane sapphire substrate. It is seen that the Ga amount in the film can be controlled by adjusting the TEG supply amount.

Figure 17:
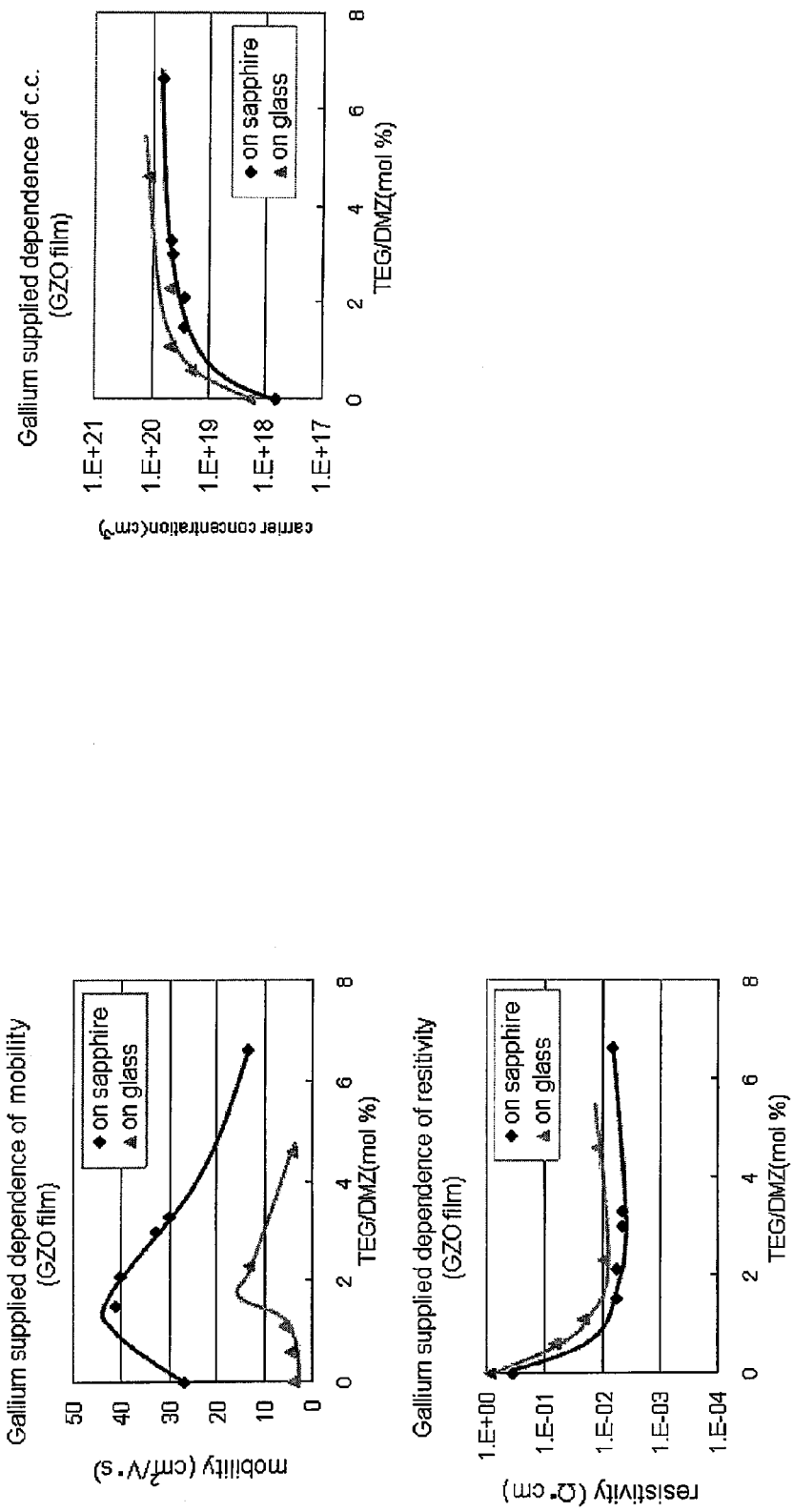
FIG. 17 is diagrams for explaining the TEG supply dependence of the electrical properties of GZO films.

FIG. 17 shows the TEG supply dependence of the electrical properties of GZO films respectively formed on a glass substrate and an a-plane sapphire substrate. The mobility, carrier concentration, and resistivity are changed depending on the TEG supply amount. Therefore, it is possible to control the electrical properties of the GZO film by adjusting the TEG supply amount.

Figure 18:
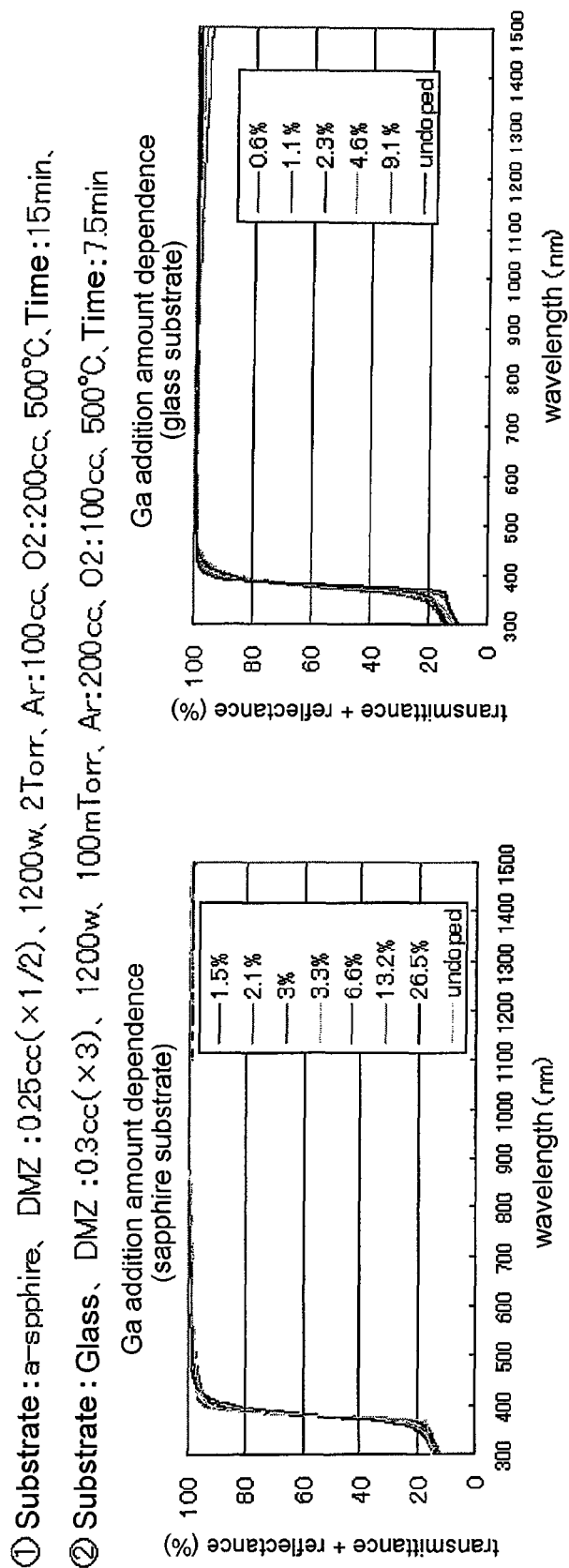
FIG. 18 is diagrams showing the optical properties of GZO films.

FIG. 18 shows the TEG supply dependence of the optical properties of GZO films respectively formed on a glass substrate and an a-plane sapphire substrate. There are obtained transparent conductive films with no absorption over a wide wavelength range of 400 nm to 1500 nm.

Using the same film forming apparatus, it is possible to form, for example, a compound thin film containing ZnO as a base material by combining materials shown in FIG. 19. Using a Mg material of FIG. 19 along with the Zn material, it is possible to form a mixed crystal ZnMgO thin film.

Further, using the same film forming apparatus, by properly selecting a thin film material of a II-VI group compound, a III-V group compound, or a IV group compound other than ZnO, it is possible to form a compound thin film containing it as a base material. For example, it is possible to form a GaN thin film using the organometallic material containing Ga and a $NH_4$ gas. FIG. 20 shows examples of materials for use in GaN-based compound thin film formation. Using an Al material of FIG. 20 along with the Ga material, it is possible to form a mixed crystal GaAlN thin film of GaN and AlN. Other than the shown examples, SiC, SiGe, and the like can also be used for film formation.

In the above-mentioned embodiment, the description has been given of the case of processing a single substrate having a size with a diameter of 33 mm.

Figure 21:
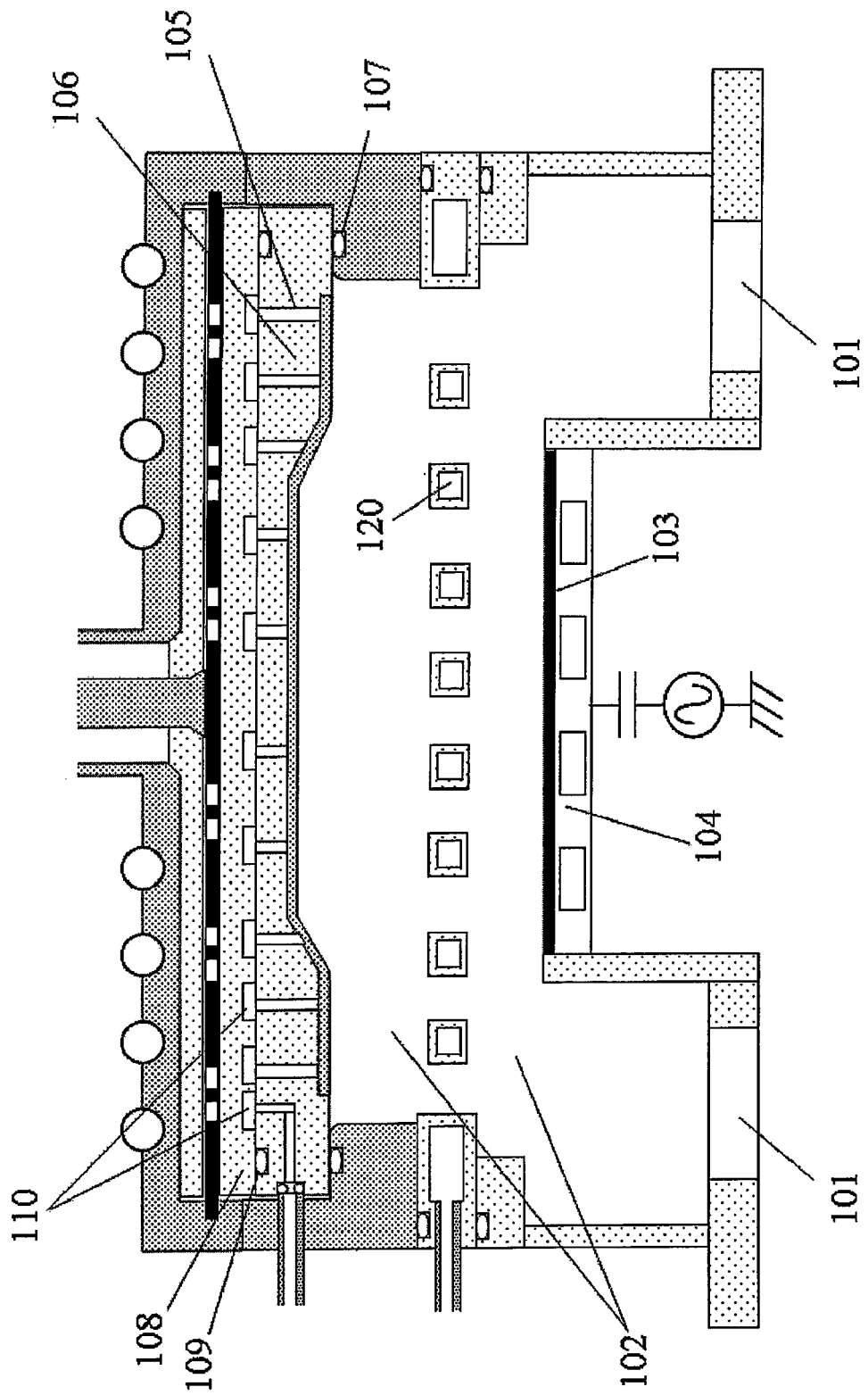
FIG. 21 is a sectional view showing a schematic structure of a large-diameter microwave plasma processing apparatus for use in this invention.

Referring to FIG. 21, there is shown a large-diameter microwave plasma processing apparatus. Using the large-diameter microwave plasma processing apparatus, the substrate size can be increased.

The microwave plasma processing apparatus shown in FIG. 21 has a process chamber 102 that is evacuated through a plurality of exhaust ports 101. A stage 104 for holding a processing substrate (film forming object such as a wafer) 103 is disposed in the process chamber 102. For uniformly evacuating the process chamber 102, the process chamber 102 defines a ring-shaped space around the stage 104 and the plurality of exhaust ports 101 are arranged at regular intervals so as to communicate with the ring-shaped space, i.e. axisymmetrically to the processing substrate 103. With this arrangement of the plurality of exhaust ports 101, the process chamber 102 can be uniformly evacuated through the plurality of exhaust ports 101.

Above the process chamber 102, at a position corresponding to the processing substrate 103 on the stage 104, a plate-shaped shower plate 106 made of dielectric alumina and formed with a number of (238) openings, i.e. gas ejection holes 105, is attached through a seal ring 107 as a part of an outer wall of the process chamber 102, thereby forming an upper shower plate. Further, over the process chamber 102, a cover plate 108 made of alumina is attached through another seal ring 109 on the outer side of the shower plate 106, i.e. on the upper side of the shower plate 106. A plurality of spaces 110 for filling a plasma excitation gas therein are formed between the upper surface of the shower plate 106 and the cover plate 108. The gas ejection holes 105 are arranged at positions corresponding to the spaces 110.

Further, the illustrated large-diameter microwave plasma processing apparatus has a lattice-shaped shower plate as a lower shower plate 120 below the plate-shaped shower plate 106.

Figure 22:
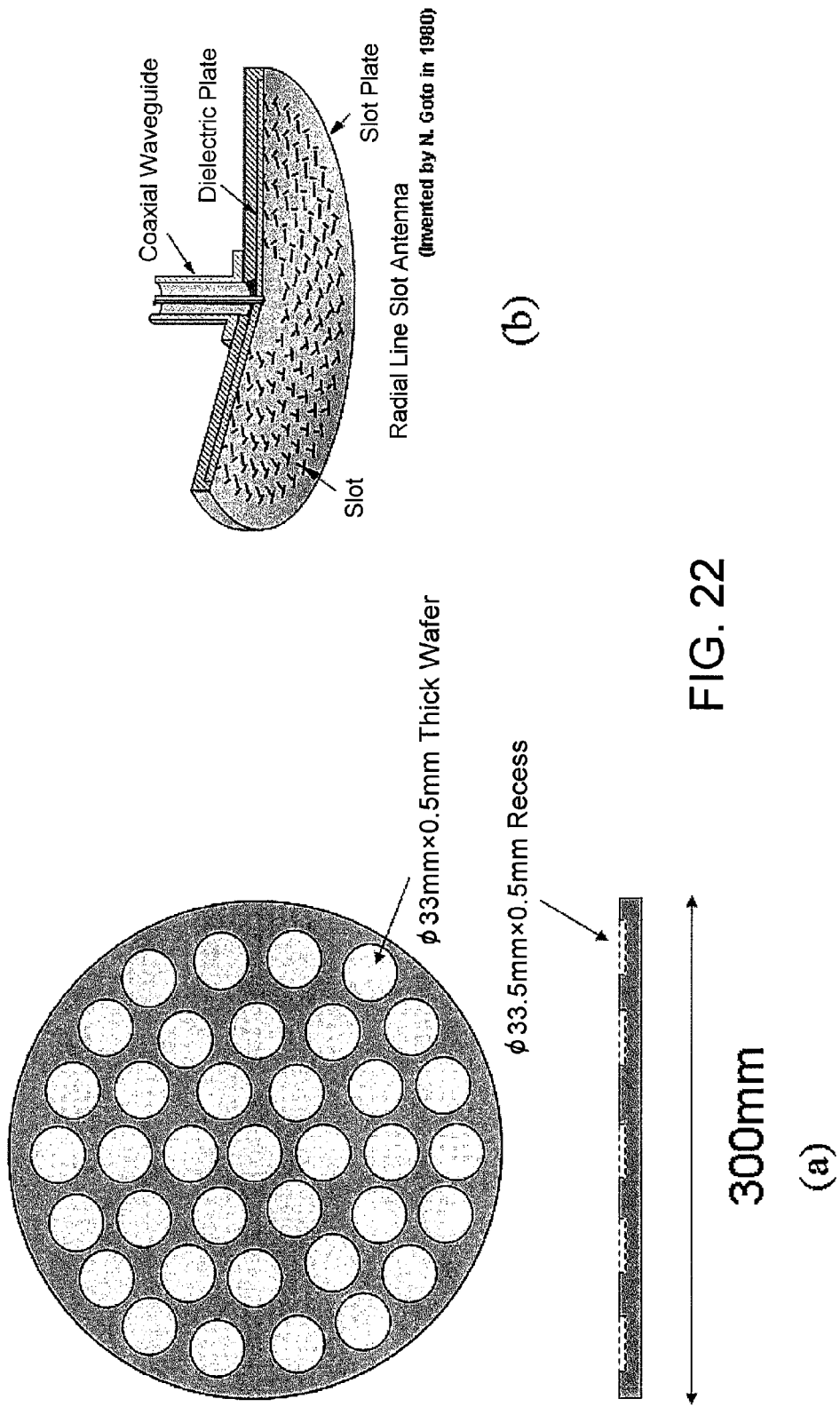
FIGS. 22(a) and (b) are diagrams showing examples of a large-diameter susceptor and an antenna for use in the large-diameter microwave plasma processing apparatus of FIG. 21.

As shown in FIG. 22(a), by providing a large-diameter susceptor as the stage 104, it is possible to process a plurality of processing substrates at a time.

Figure 23:
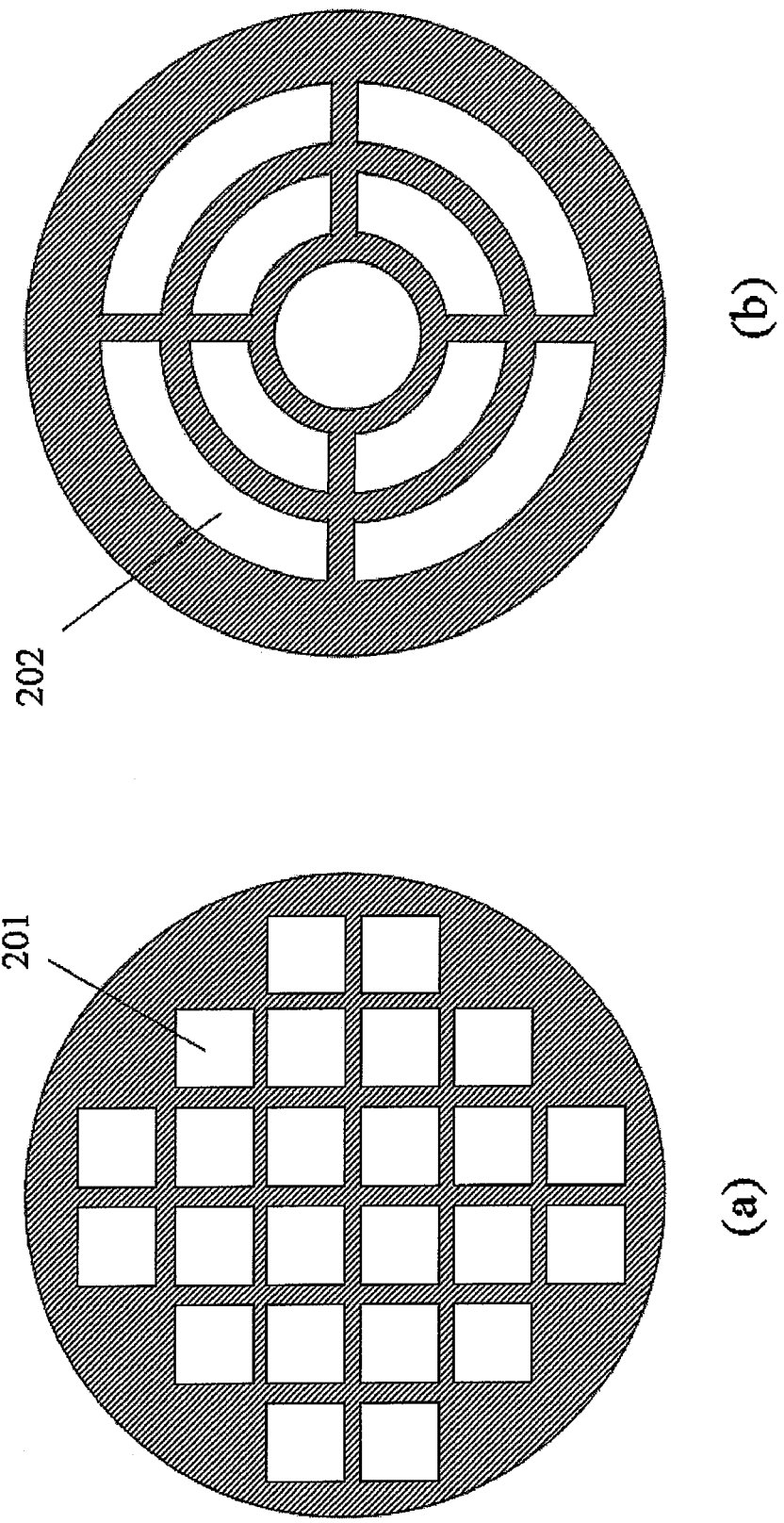
FIGS. 23(a) and (b) are diagrams showing examples of large-diameter lower shower plates each for use in the large-diameter microwave plasma processing apparatus of FIG. 21.

In this case, for uniform irradiation of a microwave over a wide range, it is effective to use a radial line slot antenna shown in FIG. 22(b). Further, using a lower shower plate 201 or 202 shown in FIG. 23(a) or (b) instead of the lower shower nozzle 4 shown in FIG. 1, it is possible to uniformly eject a material gas. In the lower shower plate 201 or 202 of FIG. 23(a) or (b), a hatched portion has a gas flow path inside and has a number of gas ejection openings (not illustrated) communicating with the gas flow path and directed toward the processing substrate. Non-hatched portions serve as openings through which a plasma passes toward the processing substrate.

Figure 24:
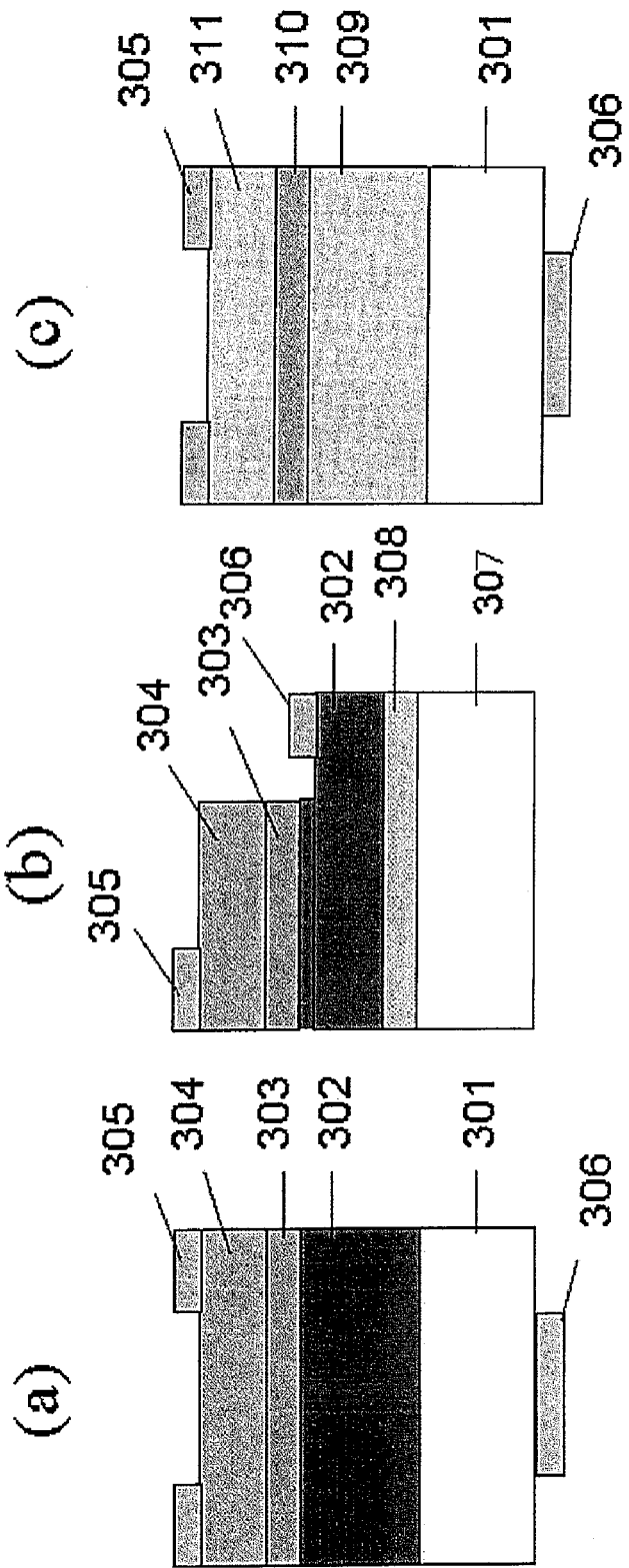
FIGS. 24(a), (b), and (c) are diagrams showing examples of semiconductor light-emitting devices having ZnO-based thin films.

Referring to FIG. 24(a) to (c), there are shown examples of semiconductor light-emitting devices according to this invention. That is, FIG. 24(a) shows a semiconductor light-emitting device produced by forming an n-type ZnO film 302, a ZnO film 303, and a p-type ZnO film 304 over a ZnO substrate 301 using the method according to this invention. Using the microwave plasma processing apparatus shown in FIG. 1 or FIG. 21, the illustrated n-type ZnO film 302, ZnO film 303, and p-type ZnO film 304 can be continuously formed by switching a gas. In the illustrated semiconductor light-emitting device an electrode (n-electrode) 306 and an electrode (p-electrode) 305 are formed on the ZnO substrate 301 and the p-type ZnO thin film 304, respectively.

FIG. 24(b) shows a semiconductor light-emitting device using a sapphire substrate 307. The illustrated semiconductor light-emitting device has a structure in which a low-temperature ZnO buffer film 308 is formed on the sapphire substrate 307 and, over the low-temperature ZnO buffer film 308, an n-type ZnO film 302, a ZnO film 303, and a p-type ZnO film 304 are formed like in FIG. 24(a). In this example, an n-electrode 306 and a p-electrode 305 are formed on the n-type ZnO film 302 and the p-type ZnO film 304, respectively. The semiconductor device shown in FIG. 24(b) has the low-temperature ZnO buffer film 308, the n-type ZnO film 302, the ZnO film 303, and the p-type ZnO film 304 and these films can be continuously formed using the microwave plasma processing apparatus shown in FIG. 1 or FIG. 21.

Further, FIG. 24(c) shows a semiconductor light-emitting device obtained by continuously forming an n-type ZnMgO film 309, a ZnO film 310, and a p-type ZnMgO film 311 over a ZnO substrate 301 using the microwave plasma processing apparatus according to this invention. In this example, a p-electrode 305 and an n-electrode 306 are formed on the p-type ZnMgO film 311 and the ZnO substrate 301, respectively.

Figure 25:
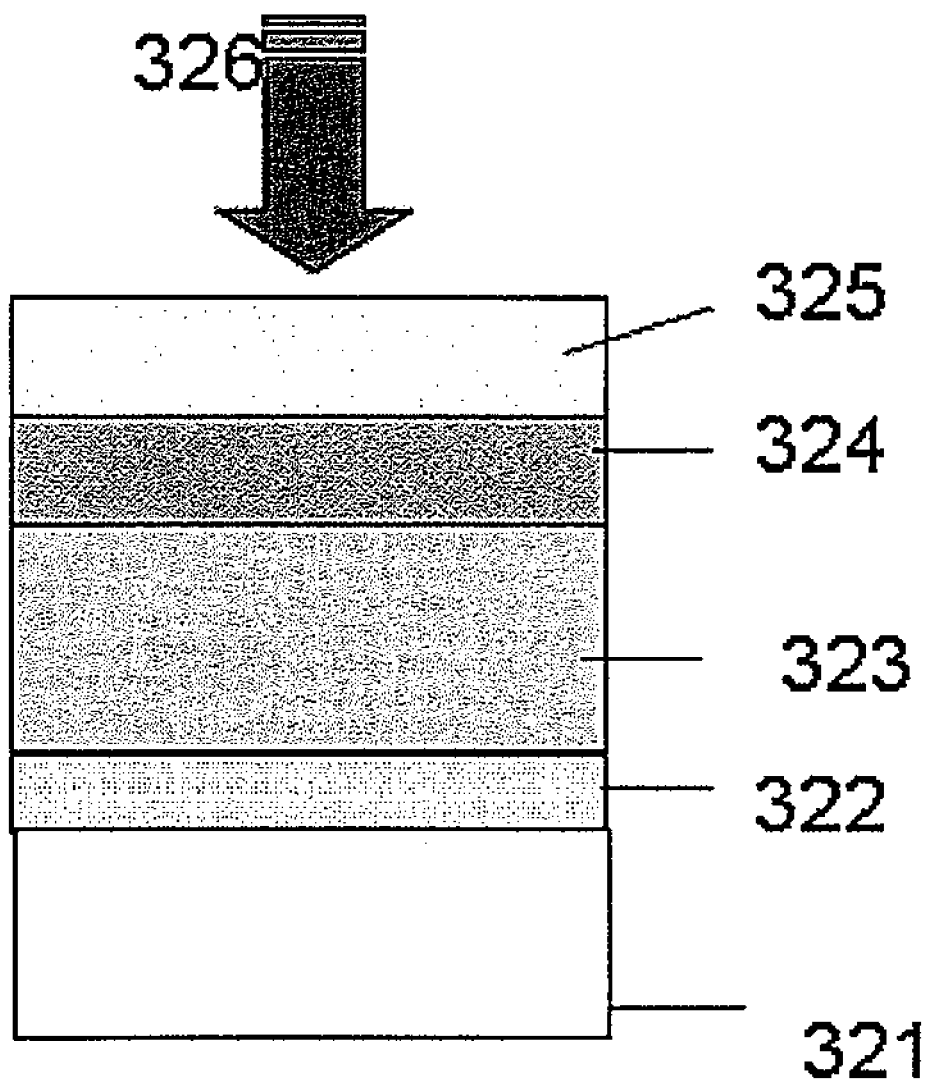
FIG. 25 is a diagram showing an example of a solar cell having a ZnO-based thin film.

Referring to FIG. 25, there is shown an example of a solar cell produced using the thin film forming method according to this invention. The illustrated solar cell has a Mo electrode 322, a Cu(In, Ga)Se$_2$ film 323, a ZnO film 324, and a transparent conductive film 325 which are formed over a glass substrate 321. Herein, the illustrated transparent conductive film 325 is formed of Ga doped ZnO (i.e. GZO). In the solar cell having such a structure, the Cu(In, Ga)Se$_2$ film 323, the ZnO film 324, and the transparent conductive film 325 can be continuously formed by the above-mentioned microwave plasma processing apparatus. In the illustrated solar cell, sunlight 326 enters from the side of the transparent conductive film 325 formed of GZO.

Figure 26:
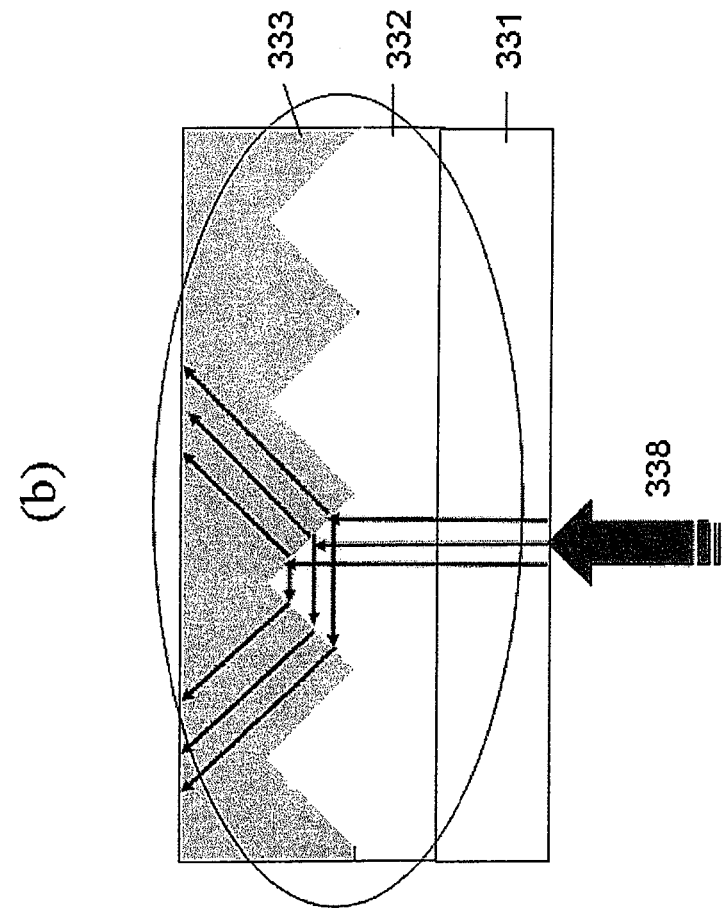
FIG. 26(a) shows an example of a solar cell having a ZnO-based transparent conductive film and FIG. 26(b) is a diagram showing a part of it in an enlarged manner.
Figure 26:
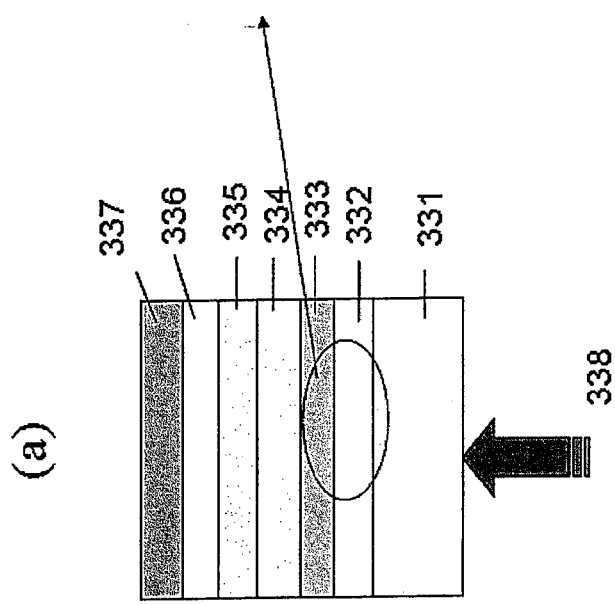

Referring to FIG. 26 (a) and (b), there is shown another example of a solar cell produced using the thin film forming method according to this invention. The solar cell shown in FIG. 26 (a) comprises a glass substrate 331, a transparent electrode 332 formed of GZO or Al doped ZnO (i.e. AZO), a p-polysilicon film 333, an i-polysilicon film 334, an n-polysilicon film 335, a transparent electrode 336 formed of GZO or AZO, and a Mo electrode 337. Among them, those from the transparent electrode 332 to the transparent electrode 336 can be continuously formed using the microwave plasma processing apparatus shown in FIG. 1 or FIG. 21. In the solar cell of this structure, sunlight 338 enters from the glass substrate 331 side.

In the illustrated structure, the ZnO-based transparent conductive film 332 serves as a film having high plasma resistance when forming the upper-layer polysilicon films. Further, the surface structure can be controlled by the film forming conditions and, as a part of FIG. 26(a) is enlargedly shown in FIG. 26(b), it is even possible to form roughness on a surface of the transparent electrode 332. According to this structure, it is possible to form a film surface with a long optical path length and thus with a light confinement effect.

Figure 27:
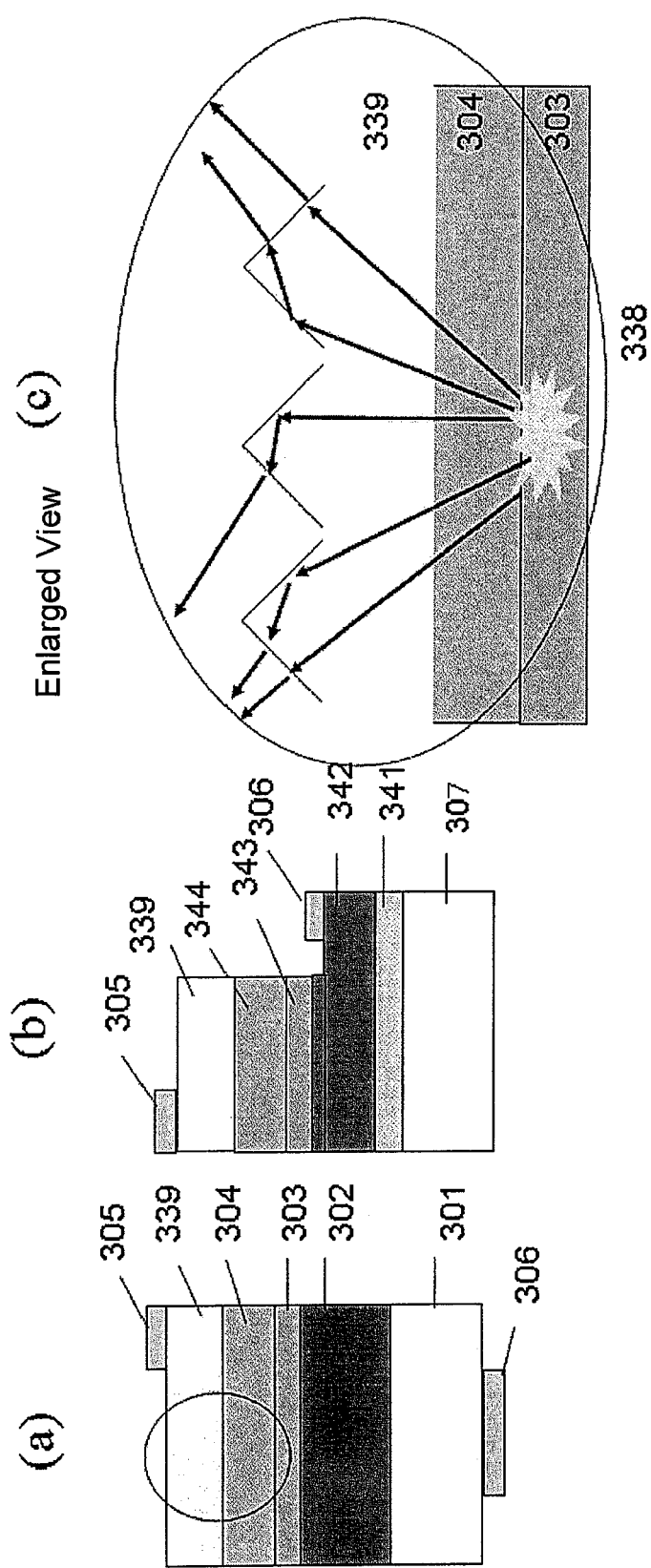
FIGS. 27(a) and (b) respectively show examples of electronic devices having a ZnO-based transparent conductive film and FIG. 27(c) is a diagram showing a part of FIG. 27(a) in an enlarged manner.

Referring to FIG. 27 (a) to (c), there are shown examples of other electronic devices having a transparent conductive film according to this invention. Among them, FIG. 27 (a) shows a light-emitting device having a ZnO-based transparent conductive film. The light-emitting device comprises a ZnO substrate 301, an n-type ZnO film 302, a ZnO film 303, and a p-type ZnO film 304 like in FIG. 24 (a) and further comprises a transparent electrode 339 formed of GZO or AZO. Further, a p-electrode 305 and an n-electrode 306 are formed on the transparent electrode 339 and the ZnO substrate 301, respectively. In this case, using the same microwave plasma processing apparatus, the thin films from the n-type ZnO film 302 to the transparent electrode 339 can be continuously formed by sequentially switching a gas depending on the thin film.

In the thin film forming method according to this invention, since a low-electron-temperature plasma is used as described before, damage to a lower layer is small in film formation so that the light emission characteristics become excellent. Further, as shown in FIG. 27(c), it is possible to form roughness on a surface of the transparent electrode 339 by selecting the film forming conditions so that it is possible to realize a surface structure with a high taking-out efficiency of light 338.

Further, FIG. 27 (b) shows an InGaN-based light-emitting device as one example of an electronic device. The InGaN-based light-emitting device shown in FIG. 27 (b) comprises a sapphire substrate 307, a low-temperature GaN buffer film 341, an n-type GaN film 342, an MQW (multiple quantum well) film 343 formed of InGaN/GaN, a p-type GaN film 344, and a transparent electrode 339 formed of GZO or AZO. The thin films from the low-temperature GaN buffer film 341 to the transparent electrode 339 of the light-emitting device of this structure can be continuously formed using the microwave plasma processing apparatus shown in FIG. 1 or FIG. 21.

Figure 28:
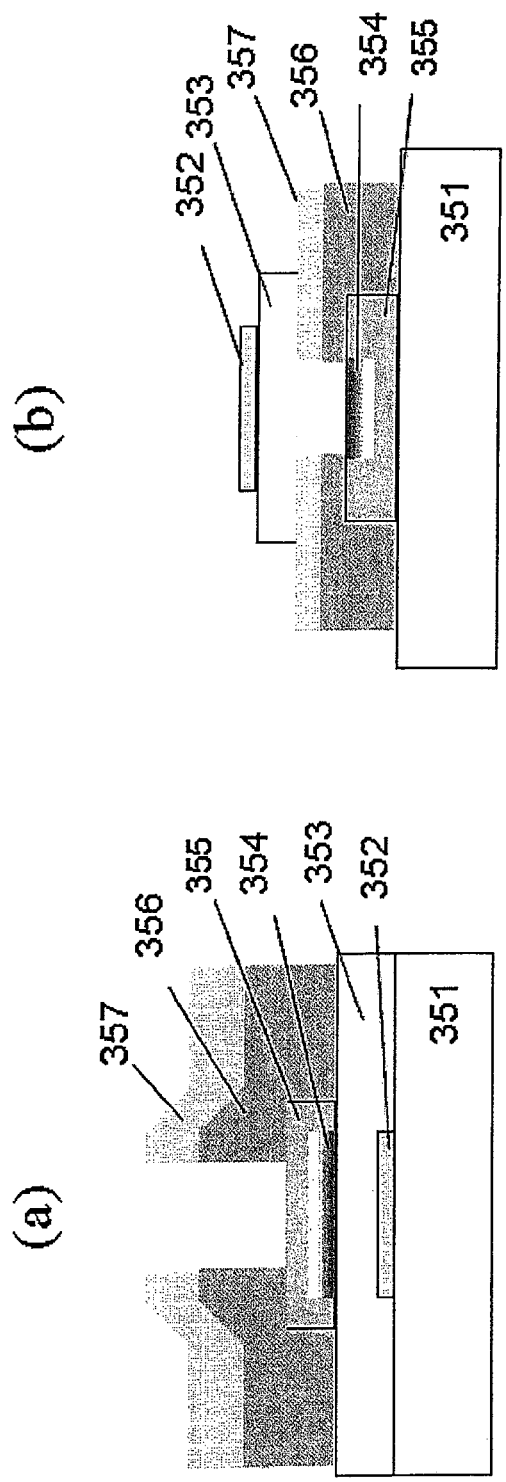
FIGS. 28(a) and (b) respectively show examples of semiconductor devices having a ZnO-based thin film in a channel region.

Referring to FIGS. 28(a) and (b), there are shown ZnO-based thin film transistors produced using the thin film forming method according to this invention. Of them, the thin film transistor shown in FIG. 28(a) has a gate electrode 352 selectively formed on a surface of a glass substrate 351 and a gate insulating film 353 provided so as to cover the gate electrode 352. Further, the illustrated thin film transistor has a ZnO film 355 selectively formed on the gate insulating film 353, n-ZnO films 356 formed with an interval therebetween on the ZnO film 355, and source and drain electrodes 357 formed on the n-ZnO films 356. Herein, in the ZnO film 355, a channel 354 is formed during operation of the thin film transistor. The ZnO film 355 defining the channel 354 and the n-ZnO films 356 can be formed using the microwave plasma processing apparatus shown in FIG. 1 or FIG. 21.

On the other hand, the thin film transistor shown in FIG. 28(b) comprises a glass substrate 351, a ZnO film 355 selectively formed on the glass substrate 351, n-ZnO films 356 arranged with an interval therebetween on the ZnO film 355, and source and drain electrodes 357 formed on the n-ZnO films 356. Further, the thin film transistor has a gate insulating film 353 provided between the source electrode and the drain electrode so as to be in contact with the ZnO film 355, and a gate electrode 352 disposed on the gate insulating film 353.

Also in the thin film transistor of this structure, a channel 354 is formed in the ZnO film 355 during operation. The illustrated ZnO film 355 and n-ZnO films 356 can be formed using the above-mentioned microwave plasma processing apparatus.

As described above, the thin film forming method according to this invention can also be applied for manufacturing an electronic device having a ZnO-based thin film in a channel region. In this case, using a low-electron-temperature high-density plasma, it is possible to form a channel region of a thin film transistor by a high-quality ZnO thin film excellent in carrier mobility.

Referring to FIG. 29(a) to (d), electronic devices comprising a resin substrate of a material with a heat resistance temperature of 200° C. or less and so on are produced by the thin film forming method of this invention. As the resin substrate, use can be made of a plastic substrate or a plastic film of PET (polyethylene terephthalate), polycarbonate, or the like.

Figure 29:
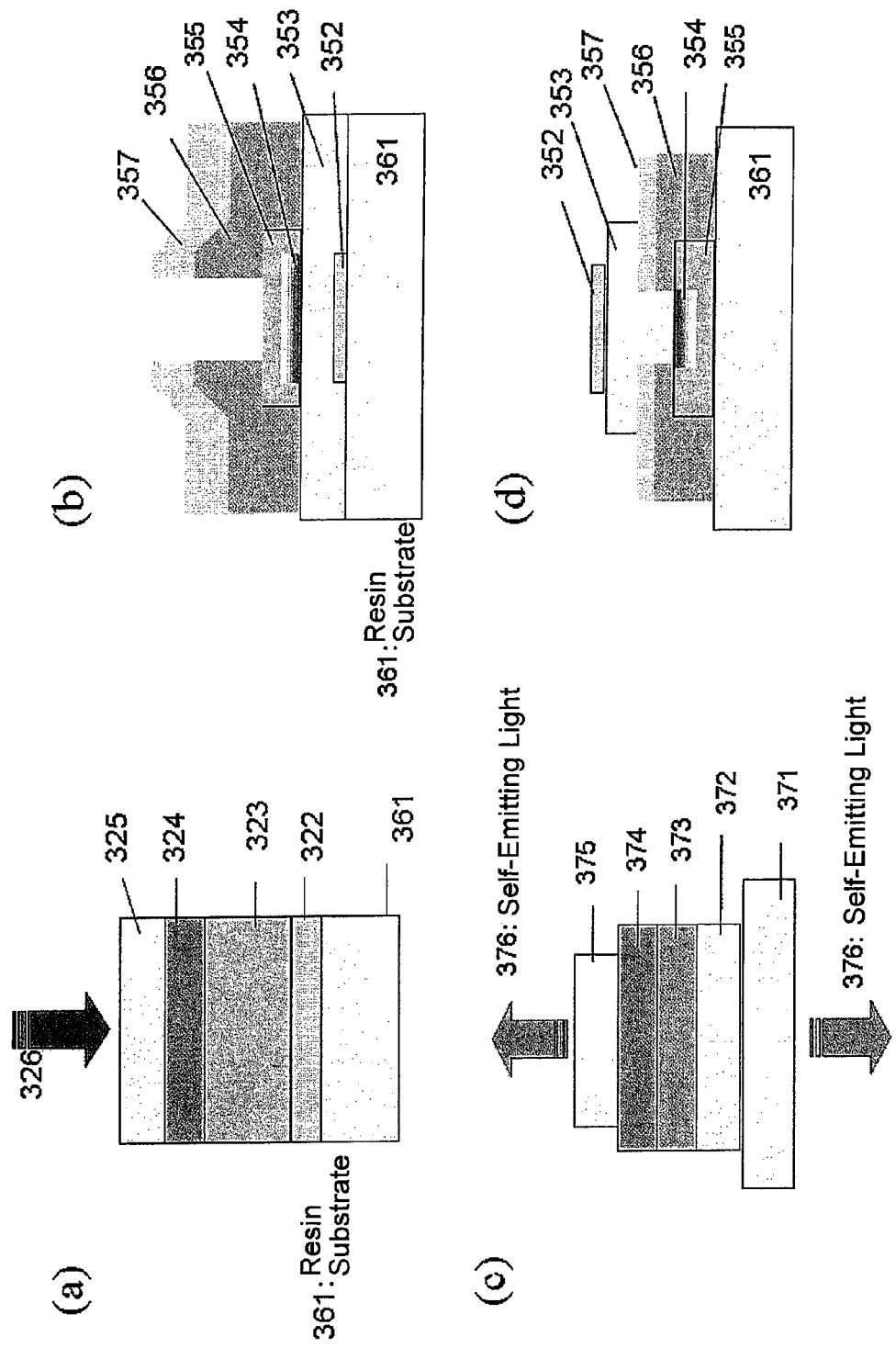
FIGS. 29(a), (b), (c), and (d) are diagrams showing examples of electronic devices configured using a resin substrate having a heat resistance temperature of 200° C. or less.

FIGS. 29(a), (b), (c), and (d) respectively show a solar cell, a ZnO-based thin film transistor, an organic EL, and a ZnO-based thin film transistor each formed on a resin substrate 361.

The solar cell shown in FIG. 29(a) is the same as the solar cell shown in FIG. 25 except that the resin substrate 361 is used. The ZnO-based thin film transistor shown in FIG. 29(b)

is the same as the ZnO-based thin film transistor shown in FIG. 28(a) except that the resin substrate 361 is used. The organic EL shown in FIG. 29(c) comprises a resin substrate 371, a GZO film 372, a hole injection layer 373, an electron injection light-emitting layer 374, and a GZO film 375. The illustrated organic EL is an example of emitting light in both upper and lower directions as shown by 376. Also in this case, the thin film forming method of this invention can be applied for forming the GZO films 372 and 375.

The ZnO-based thin film transistor shown in FIG. 29(d) is the same as the ZnO-based thin film transistor shown in FIG. 28(b) except that the resin substrate 361 is used.

Conventionally, it was difficult to form a high-quality thin film on a resin substrate at a low temperature and thus it was difficult to manufacture an electronic device on the resin substrate. In this invention, using a low-electron-temperature high-density plasma, it is possible to form a high-quality thin film on a resin substrate at a low temperature and thus, as shown in FIG. 29(a) to (d), it is possible to form various electronic devices on resin substrates, respectively.

Figure 30:
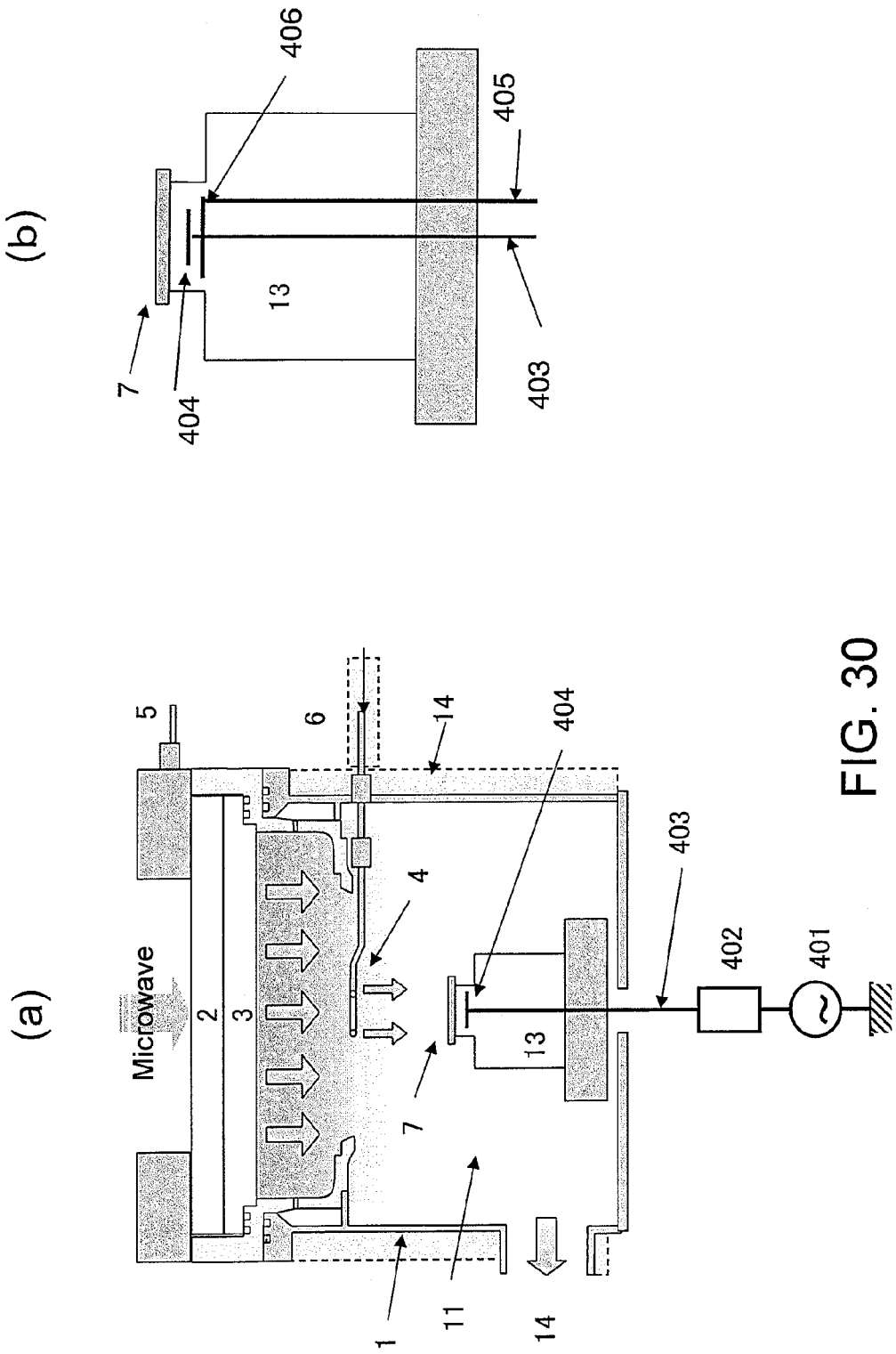
FIGS. 30(a) and (b) are diagrams for explaining, as a second embodiment of this invention, an example of a thin film forming apparatus adapted to use ion irradiation by bias potential application and are diagrams showing examples of a film forming apparatus adapted to control ion irradiation by radio-frequency power application and a stage for applying a radio-frequency power.

FIGS. 30(a) and (b) show schematic diagrams of a plasma processing apparatus according to a second embodiment of this invention. The plasma processing apparatus according to the second embodiment is characterized by, in addition to the structure of the first embodiment, applying a bias potential to a processing substrate (film forming object) to thereby irradiate ions in a plasma onto a film surface.

FIG. 30(a) is a schematic sectional view of a film forming apparatus adapted to control ion irradiation by radio-frequency application, wherein the same portions as those shown in FIG. 1 are assigned the same reference numerals. A radio-frequency power generated from a radio-frequency oscillator 401 is supplied, through a matching circuit 402 and a conductive line 403, to an electrode 404 provided in an upper portion, where a processing substrate 7 is placed, of a stage 13. The frequency of the high-frequency oscillator 401 is 2 MHz or more and 200 MHz or less and particularly preferably 13.56 MHz to 40.68 MHz.

FIG. 30(b) shows an example of a stage for applying a radio-frequency power. The radio-frequency power from the radio-frequency oscillator 401 reaches the electrode 404 through the conductive line 403. In this example, there are provided an electric heater 406 for heating the stage and a power line 405 for supplying the power to the heater 406. When a processing substrate is conductive, a DC voltage may be directly applied to the processing substrate.

Figure 31:
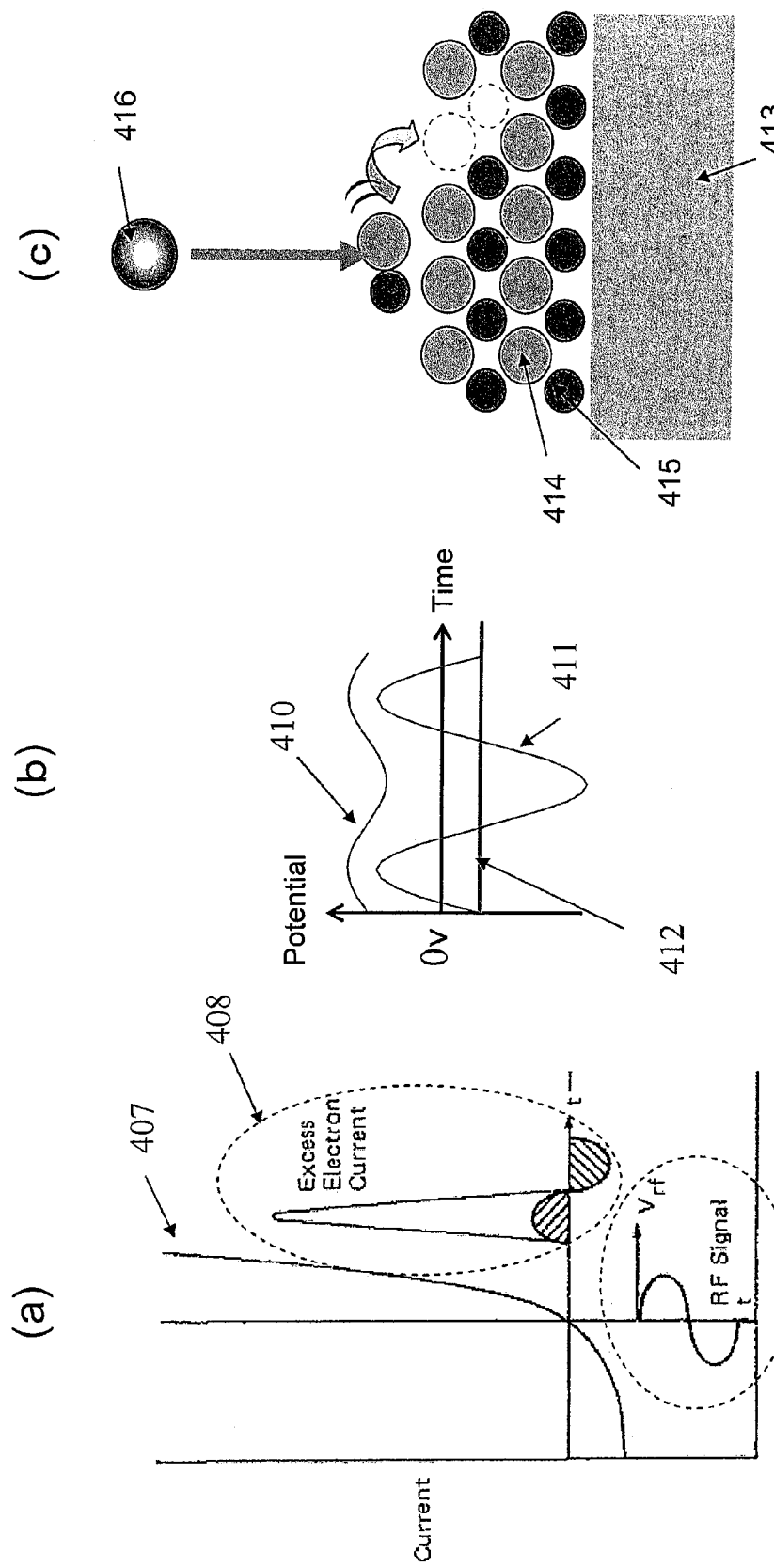
FIGS. 31(a), (b), and (c) are diagrams for explaining a thin film forming method using ion irradiation by bias potential application, which is the second embodiment of this invention, wherein FIGS. 31(a) and (b) are diagrams for explaining the principle of bias potential generation by radio-frequency power application
FIG. 31(c) is a diagram showing the concept of ZnO film formation using ion irradiation.

Referring to FIG. 31(a) to (c), a description will be given of the concept of a thin film forming method using ion irradiation by bias potential application, which is the feature of the second embodiment of this invention. FIGS. 31(a) and (b) show the principle of bias potential generation by radio-frequency power application.

A curve 407 in FIG. 31(a) represents the current-voltage characteristics of a plasma. When a radio-frequency signal 409 is applied to the electrode 404 of the stage 13, a current shown in a broken line 408 flows. Since an electron is far lighter than an ion, an excess electron current more than an ion current flows. As shown in FIG. 31(b), a negative self-bias potential 412 is generated in a direction to suppress the excess electron current. FIG. 31(b) also shows a substrate potential 411 and a plasma potential 410. Ions are accelerated by an energy corresponding to a potential difference between the plasma potential 410 and the self-bias potential 412 and irradiated onto a film surface.

FIG. 31(c) shows a conceptual diagram of ZnO film formation using ion irradiation. A processing substrate 413 is at the negative self-bias potential 412 so that positive ions 416 in a plasma are irradiated toward the processing substrate 413. It is considered that when the positive ions 416 impinge on a surface of a ZnO film formed on the processing substrate 413, migration of Zn atoms 414 and O atoms 415 is induced. The kind of the positive ions 416 differs depending on the conditions of a gas to be used, but Ar+ ions, Kr+ ions, Xe+ ions, He+ ions, N+ ions, NO+ ions, P+ ions, As+ ions, or the like are effective.

Figure 32:
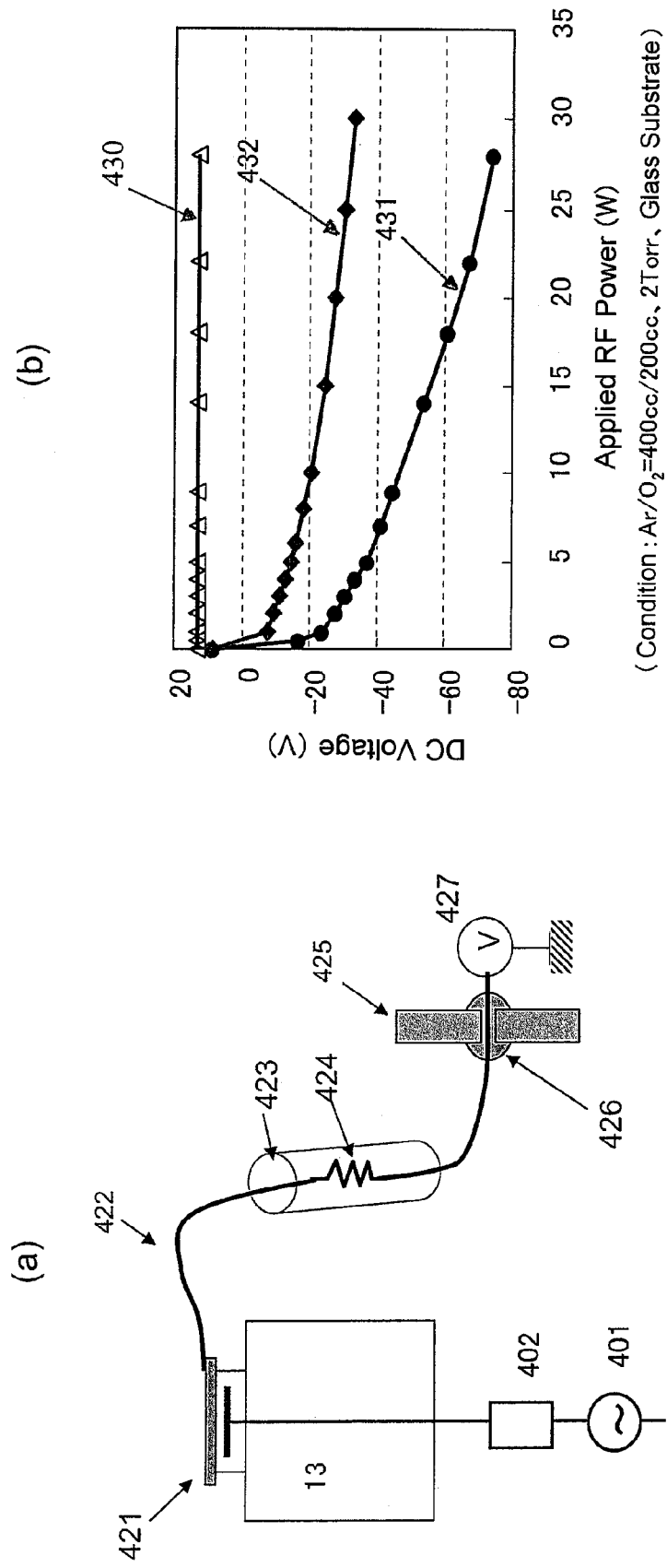

Referring to FIGS. 32(a) and (b), a description will be given of Example 1 about the control of a bias potential by radio-frequency power application. FIG. 32(a) shows a method of measuring a self-bias potential Vdc. A metal plate 421 with a ceramic-coated conductor 422 connected thereto is placed on a stage 13. A resistance 424 is connected to the ceramic-coated conductor 422 to interrupt a current from a plasma. The ceramic-coated conductor 422 passes through a hole provided in a wall 425 of a process chamber and leads to the outside of the process chamber. The hole of the wall 425 is sealed with a vacuum adhesive 426. The resistance 424 is protected from a plasma by a glass pipe 423. A plasma is ignited and the potential over the stage 13 is measured by a voltmeter 427. FIG. 32(b) shows an example 1 of self-bias potential measurement results. In a graph, the horizontal axis represents the applied RF power and the vertical axis represents the DC potential. A curve 431 represents the self-bias potential when the RF frequency is 13.56 MHz. A curve 432 represents the self-bias potential when the RF frequency is 40.68 MHz. A plasma potential 430 is also shown in addition to the self-bias potential. By increasing the frequency from 13.56 MHz to 40.68 MHz, the self-bias potential is reduced.

Figure 33:
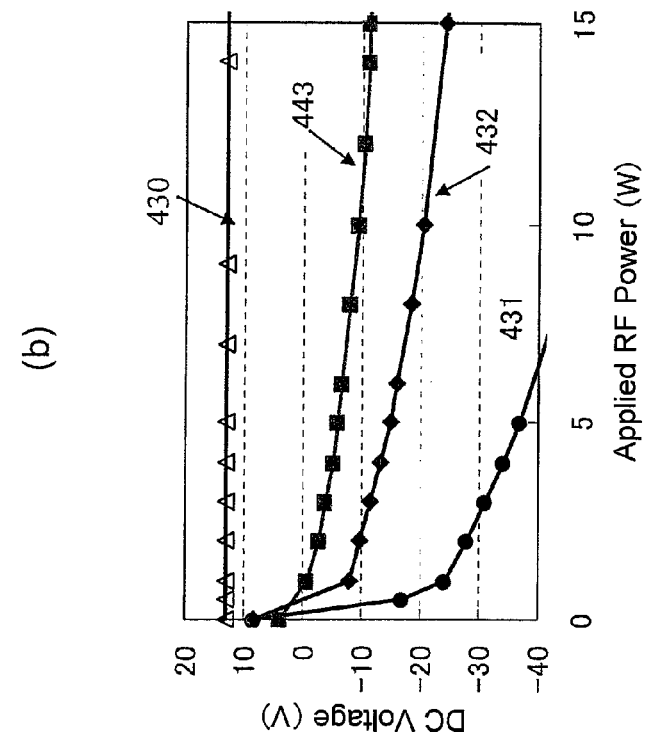

Referring to FIGS. 33(a) and (b), a description will be given of Example 2 about the control of a bias potential by radio-frequency power application. FIG. 33(a) shows a stage for suppressing the applied power per unit area. A radio-frequency power signal from a radio-frequency oscillator 401 reaches electrodes 440 through a conductive line 403. Since the area of the electrodes 440 is large, even if the applied power is the same, the power supplied to the electrode under a processing substrate is reduced in area ratio. A portion where the electrode is present is covered with an insulator 441. Other than a portion where the processing substrate is placed, the stage is protected from a plasma by a ceramic protection plate. As described before, there are also provided an electric heater 406 for heating the stage and a power line 405 for supplying the power to the heater 406. FIG. 33(b) shows an example 2 of self-bias potential measurement results. A curve 431 represents the self-bias potential when the RF frequency is 13.56 MHz and the stage of FIG. 30(b) is used. A curve 432 represents the self-bias potential when the RF frequency is 40.68 MHz and the stage of FIG. 30(b) is used. A curve 443 represents the self-bias potential when the RF frequency is 40.68 MHz and the stage of FIG. 33(a) is used. A plasma potential 430 is also shown in addition to the self-bias potential. By increasing the electrode area of the stage, the self-bias potential is reduced.

FIG. 34(a) to (c) show an improved example 1 of ZnO thin film formation using ion irradiation by radio-frequency power application, wherein there is shown the relationship between the properties of a ZnO film formed on an a-plane sapphire substrate and the radio frequency power when the RF frequency is 40.68 MHz and the stage of FIG. 33(a) is used. Particularly, FIG. 34(a) shows the relationship between the (002)-plane ω-scan measurement half-width, representing the crystallinity, obtained by X-ray diffraction measurement and the RF bias power, wherein the crystallinity is best around 60 W. FIG. 34(b) shows the relationship between the mobility and the RF bias power, wherein the mobility is best around 40 W to 100 W. FIG. 34(c) shows the relationship between the carrier concentration and the RF bias power, wherein the carrier concentration decreases as the power increases. Films of the respective data shown in the figure are polycrystalline films.

Figure 34:
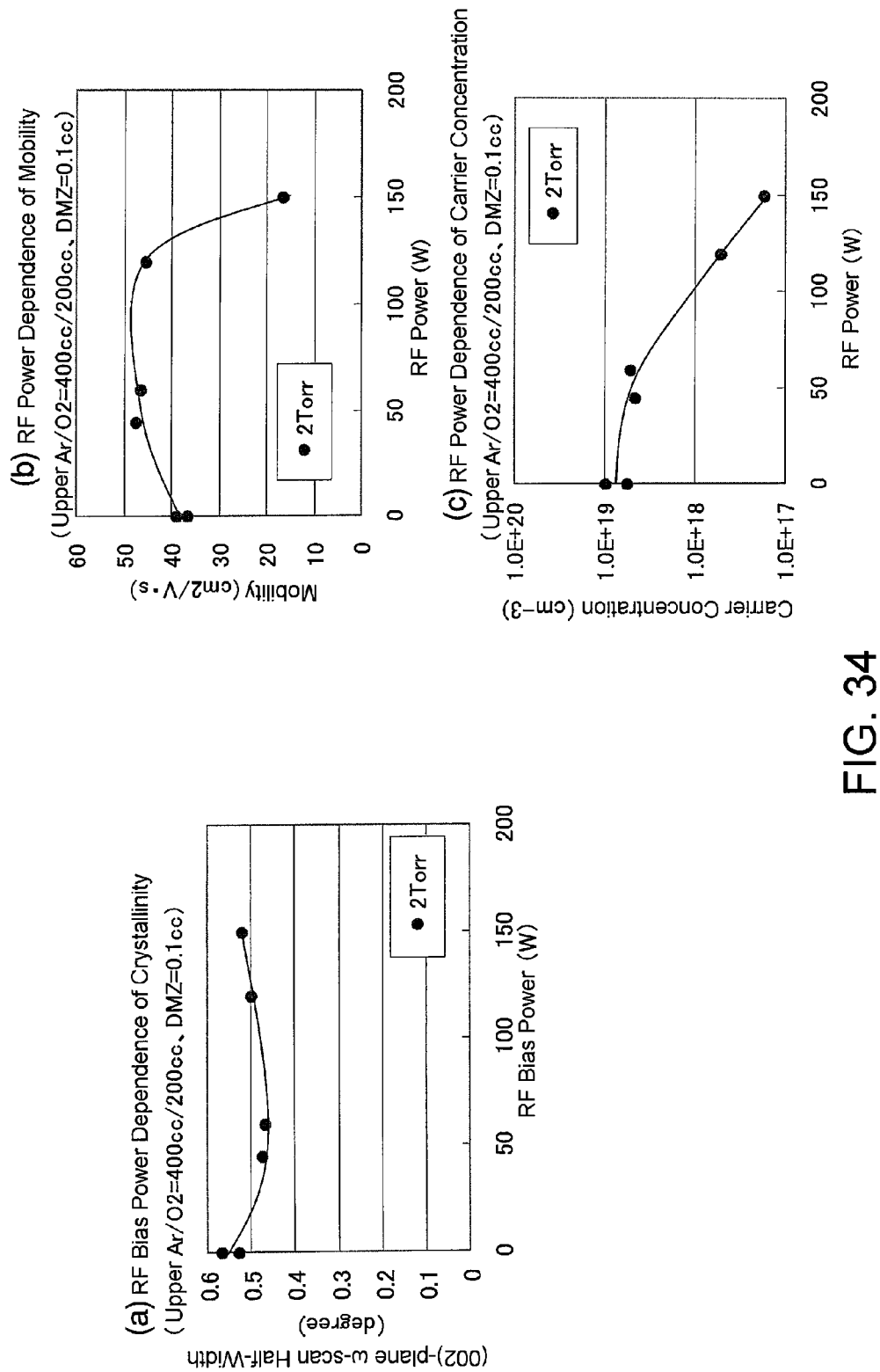
FIGS. 34(a), (b), and (c) are diagrams for explaining an improved example 1 of ZnO thin film formation using ion irradiation by radio-frequency power application and are diagrams respectively showing the radio-frequency power dependence of the crystallinity, the radio-frequency power dependence of the mobility, and the radio-frequency power dependence of the carrier concentration, of a ZnO film formed on an a-plane sapphire substrate.
Figure 35:
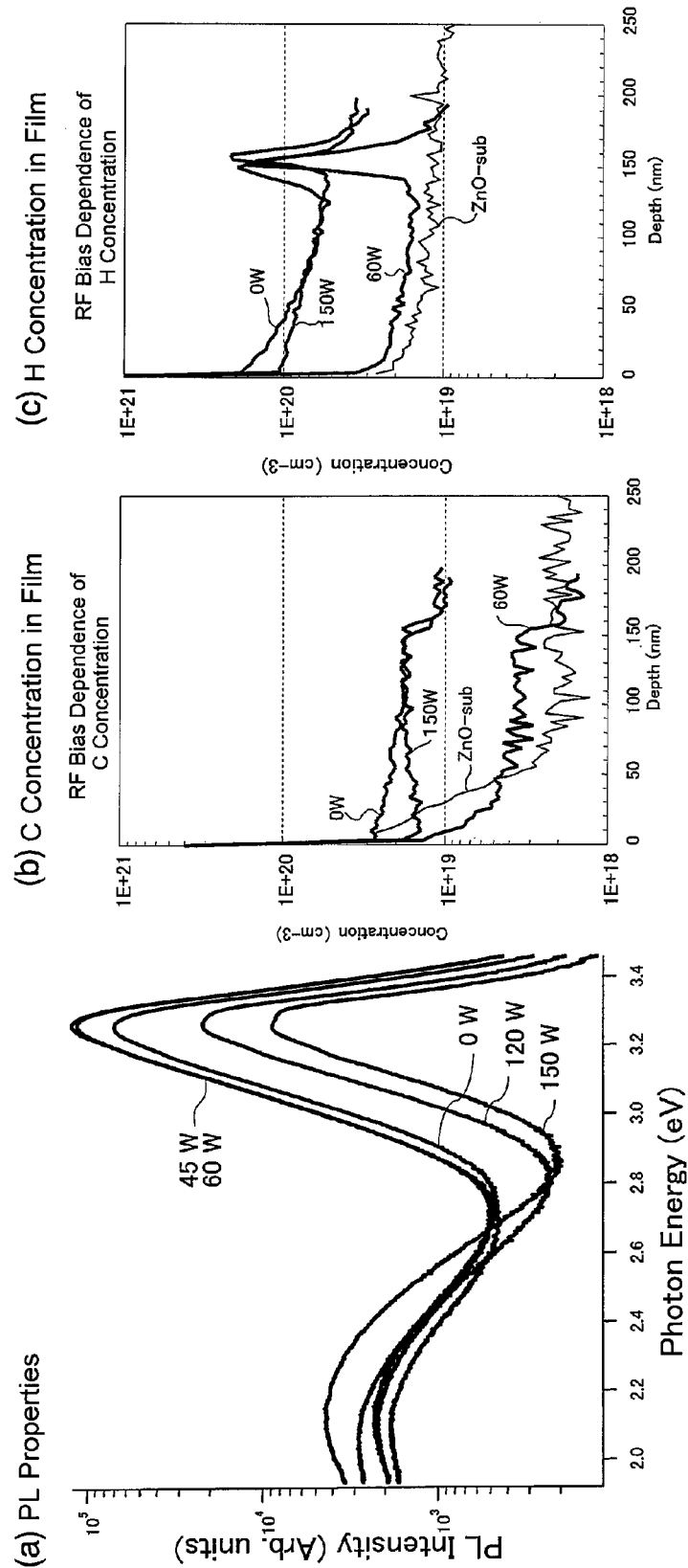
FIGS. 35(a), (b), and (c) are diagrams showing an improved example 1 of ZnO thin film formation using ion irradiation by radio-frequency power application and are diagrams respectively showing the photoluminescence properties of ZnO films formed on a-plane sapphire substrates, the carbon concentration in the films obtained by SIMS analysis, and the hydrogen concentration in the films obtained by SIMS analysis.

FIG. 35(a) to (c) show the crystallinity of the ZnO films of FIG. 34 and the amounts of impurities in the films. Particularly, FIG. 35(a) shows the photoluminescence (PL) properties, wherein the results are better at an RF bias power of 45 W or 60 W than at 0 W. FIGS. 35(b) and (c) respectively show the carbon concentration and the hydrogen concentration in the films obtained by SIMS analysis. In either case, the ZnO film has a lower concentration and thus less impurities at an RF bias power of 60 W than at 0 W. As described above, it is seen that the film properties can be improved by ion irradiation with proper RF bias application as compared with case of no ion irradiation. The bias potential measurement shows that when the RF frequency is 40.68 MHz and the stage of FIG. 33(a) is used, the bias potential is −20V at an RF bias power of 45 W, −22V at 60 W, and −30V or less (absolute value is 30V or more) at 150 W. From the above, the bias potential is preferably −0.1V to −30V for improving the film properties of a polycrystalline film or a single-crystalline film.

Since the crystallinity is dagraded as the value of the bias potential increases and thus the ion irradiation energy increases, the bias potential is preferably −30V or less (absolute value is 30V or more) for obtaining an amorphous film. It is effective for formation of a channel layer of a thin film transistor, or the like.

Figure 36:
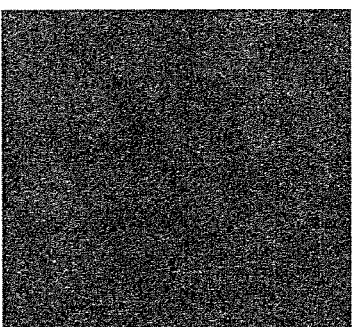
FIG. 36 is a diagram showing an improved example 2 of ZnO thin film formation using ion irradiation by radio-frequency power application, wherein there are shown surface SEM images of ZnO films respectively formed on ZnO substrates without RF bias application and with RF bias application.
Figure 36:
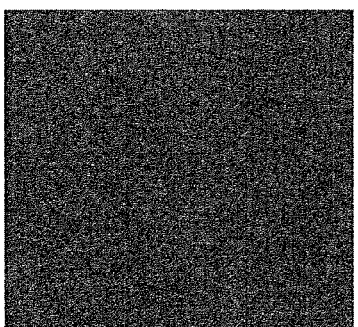

FIG. 36 shows an improved example 2 of ZnO thin film formation using ion irradiation by radio-frequency power application, wherein there is shown a surface SEM image of a ZnO film formed on a ZnO substrate when the RF frequency is 40.68 MHz and the stage of FIG. 30(b) is used. The thin film formed on the ZnO substrate by this manufacturing method is single-crystalline regardless of radio-frequency power application. The smooth film is obtained with the RF bias application as compared with the case of no RF bias application. Accordingly, the ion irradiation is effective for improving the film structure.

From the above, in the second embodiment, the bias potential is preferably set as follows.

(1) The bias potential to be applied is set to a potential that causes a half-width, obtained by X-ray diffraction measurement, of a formed thin film to be reduced as compared with the case of no bias potential application.

(2) The bias potential to be applied is set to a potential that causes the mobility of a formed thin film to be increased as compared with the case of no bias potential application.

(3) The bias potential to be applied is set to a potential that causes the concentration of impurities contained in a formed thin film to be reduced as compared with the case of no bias potential application.

(4) The bias potential to be applied is set to a potential that causes the photoluminescence properties of a formed thin film to be improved as compared with the case of no bias potential application.

(5) The bias potential to be applied is set to a potential that causes a intensity of band-edge luminescence peculiar to a material of a formed thin film in photoluminescence property to be increased and further causes luminescence intensities of deep levels to be reduced as compared with the case of no bias potential application.

(6) The bias potential to be applied is set to a potential that causes the flatness of the film structure of a formed thin film to be improved as compared with the case of no bias potential application.

Figure 37:
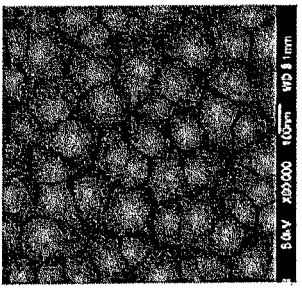
FIG. 37 shows an improved example of ZnO thin film formation by an increase in substrate temperature and is a diagram showing the relationship between the properties of ZnO films formed on a-plane sapphire substrates and the stage temperatures.
Figure 37:
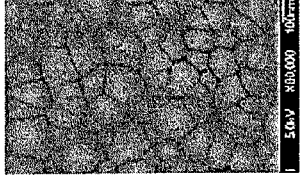
Figure 37:
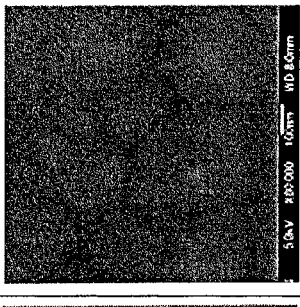

FIG. 37 shows, as an improved example of ZnO thin film formation by an increase in substrate temperature, the relationship between the properties of ZnO films formed on a-plane sapphire substrates and the stage temperatures. Herein, there are shown film surface SEM images corresponding to the results at stage temperatures of 400° C., 500° C., and 550° C., the (002)-plane ω-scan measurement half-widths representing the crystallinity, and the mobility. The film properties are improved as the stage temperature increases.

Figure 38:
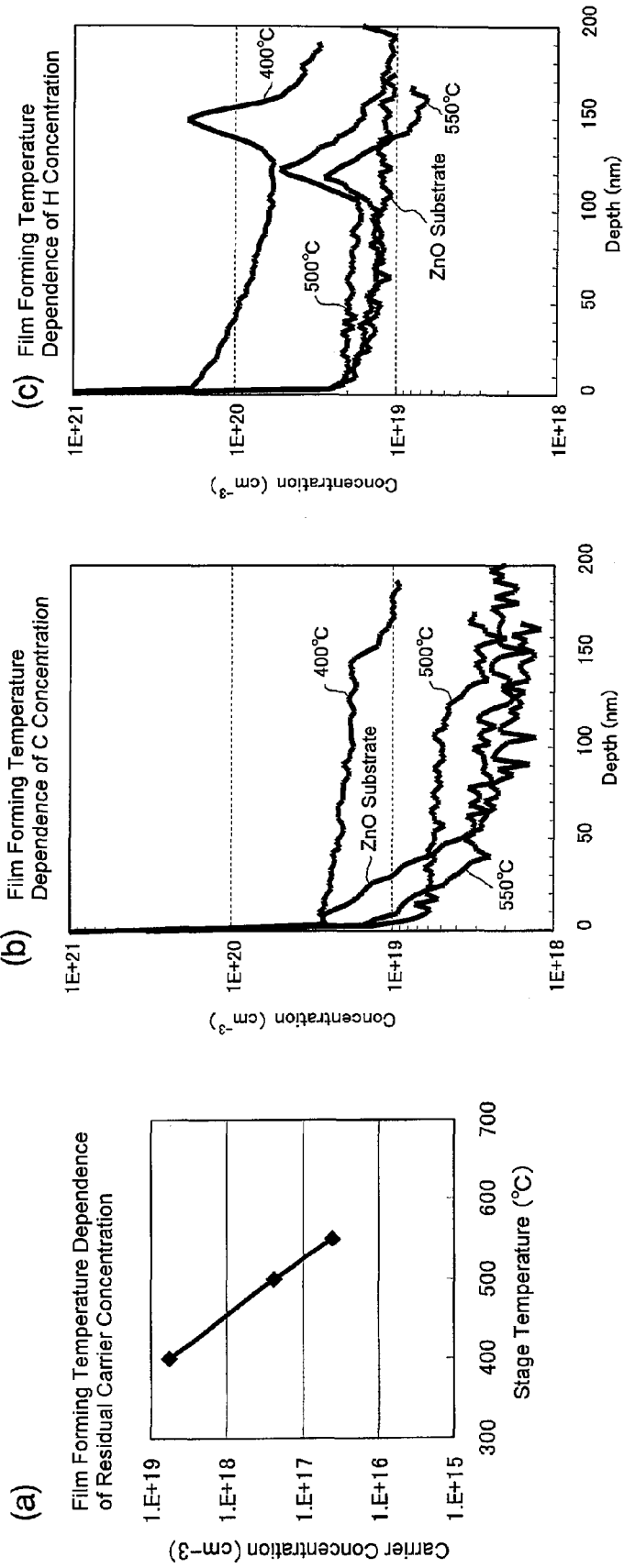
FIGS. 38(a), (b), and (c) show an improved example of ZnO thin film formation by an increase in substrate temperature and are diagrams showing the relationship between the properties of ZnO films formed on a-plane sapphire substrates and the stage temperatures, wherein there are respectively shown the relationship between the residual carrier density in the ZnO films and the stage temperatures, the relationship between the carbon concentration in the films obtained by SIMS analysis and the stage temperatures, and the relationship between the hydrogen concentration in the film obtained by SIMS analysis and the stage temperatures.

FIG. 38(a) to (c) show, with respect to the ZnO films shown in FIG. 37, the relationship between the residual carrier concentration in the film/the amount of impurities in the film and the stage temperature. Particularly, FIG. 38(a) shows that the residual carrier concentration decreases by the increase in stage temperature. FIGS. 38(b) and (c) respectively show the carbon concentration and the hydrogen concentration in the films obtained by SIMS analysis, wherein it is shown that the concentration of impurities decreases by the increase in stage temperature. By setting the substrate temperature to 500° C. or more, the properties of the formed ZnO film can be improved.

While this invention has been described with reference to the embodiments, this invention is not limited thereto. Various changes that can be understood by a person skilled in the art can be made to the structures and details of this invention within the spirit and scope of this invention described in claims.

INDUSTRIAL APPLICABILITY

As described above, a thin film made of a II-VI group compound, a III-V group compound, or a IV group compound and its forming method according to this invention are optimum for an electronic device such as a light-emitting device with high light emission efficiency or a solar cell, a display device, a display element, or a light-emitting device with high efficiency and for an electronic device such as a solar cell, a display device, a display element, a light-emitting device or a semiconductor device comprising a substrate made of a material with low heat resistance.

What is claimed is:

1. A thin film forming method comprising supplying a gas containing at least an organometallic material gas into a plasma generated using a microwave-excited high-density plasma generator, thereby forming, on a film forming object, a thin film of at least one of a II-VI group compound, a III-V group compound, and a IV group compound, the method further comprising applying a bias potential to the film forming object to irradiate ions in the plasma onto a surface of the film, and setting the bias potential to be applied to a potential that causes a half-width, obtained by X-ray diffraction measurement, of the formed thin film to be reduced as compared with a case of no bias potential application.

2. A thin film forming method according to claim 1, comprising setting the bias potential to be applied to −0.1V to −30V.

3. A thin film forming method according to claim 1, comprising setting the bias potential to be applied to −30V or less (absolute value is 30 or more).

4. A thin film forming method according to claim 1, comprising using, as the organometallic material gas, an organometallic gas containing at least one of elements of the II group, the III group, the IV group, the V group, and the VI group.

5. A thin film of a II-VI group compound, a III-V group compound, or a IV group compound formed using the thin film forming method according to claim 1.

6. A thin film according to claim 5, wherein the thin film has a conductivity.

7. A thin film according to claim 5, wherein the thin film is transparent.

8. A thin film according to claim 5, wherein the thin film is single-crystalline.

9. A thin film according to claim 5, wherein the thin film is polycrystalline.

10. A thin film according to claim 5, wherein the thin film is amorphous.

11. A thin film according to claim 5, wherein the thin film contains no indium as a constituent element.

12. A light-emitting device comprising the thin film according to claim 5.

13. A solar cell comprising the thin film according to claim 5.

14. An electronic device comprising the thin film according to claim 5, which is transparent and conductive.

15. A semiconductor device using the thin film according to claim 5 as a channel region.

16. A thin film forming method of II-VI group comprising supplying a gas containing at least an organometallic material gas into a plasma generated using a microwave-excited high-density plasma generator, thereby forming, on a film forming object, a thin film of a II-VI group compound, the method further comprising applying a bias potential to the film forming object to irradiate ions in the plasma onto a surface of the film, and setting the bias potential to be applied to a potential that causes a half-width, obtained by X-ray diffraction measurement, of the formed thin film to be reduced as compared with a case of no bias potential application, the method using Zn only or Zn and at least one of Mg, Cd and Mn for the II element and using O for the VI element.

17. A thin film forming method of n-type II-VI group compound according to claim 16, using at least one of Ga and Al for the doping material of n-type conductivity.

18. A thin film forming method of p-type II-VI group compound according to claim 16, using at least one of N, As and P for the doping material of p-type conductivity.

19. A thin film forming method of p-type II-VI group compound according to claim 18, in the case of N for the doping material of p-type conductivity, using at least one of $N_2$, NO, $NO_2$, $N_2O$, and NH4.

20. A thin film of II-VI group compound formed using the thin film forming method according to claim 16.

21. A thin film of n-type II-VI group compound formed using the thin film forming method according to claim 17.

22. A thin film of p-type II-VI group compound formed using the thin film forming method according to claim 18.

23. A thin film of p-type II-VI group compound formed using the thin film forming method according to claim 19.

24. A light-emitting device comprising the thin film according to claim 23.

25. A solar cell comprising the thin film according to claim 21.

26. A thin film forming method according to claim 1, comprising setting the bias potential to be applied to a potential that causes a mobility of the formed thin film to be increased as compared with a case of no bias potential application.

27. A thin film forming method according to claim 1, comprising setting the bias potential to be applied to a potential that causes a concentration of impurities contained in the formed thin film to be reduced as compared with a case of no bias potential application.

28. A thin film forming method according to claim 1, comprising setting the bias potential to be applied to a potential that causes a photoluminescence property of the formed thin film to be improved as compared with a case of no bias potential application.

29. A thin film forming method according to claim 28, comprising setting the bias potential to be applied to a potential that causes an intensity of band-edge luminescence peculiar to a material of the formed thin film in photoluminescence property to be increased and further causes luminescence intensities of other levels to be reduced as compared with a case of no bias potential application.

30. A thin film forming method according to claim 1, comprising setting the bias potential to be applied to a potential that causes a flatness of a film structure of the formed thin film to be improved as compared with a case of no bias potential application.

31. A thin film according to claim 8, wherein the thin film is formed on a glass substrate.

32. A thin film according to claim 9, wherein the thin film is formed on a resin substrate.

33. A thin film according to claim 8, wherein the thin film is formed using a substrate that can bear a temperature of 500° C. or more.

34. An electronic device comprising the thin film according to claim 32 and using a resin substrate of a material with a heat resistance temperature of 200° C. or less.

* * * * *